(12) United States Patent
Yamada

(10) Patent No.: US 10,803,957 B2
(45) Date of Patent: *Oct. 13, 2020

(54) MONITORING AND CHARGING INHIBIT BIT-LINE

(71) Applicant: Micron Technology, Inc., Boise, ID (US)

(72) Inventor: Shigekazu Yamada, Suginamiku (JP)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/716,043

(22) Filed: Dec. 16, 2019

(65) Prior Publication Data

US 2020/0118634 A1   Apr. 16, 2020

Related U.S. Application Data

(63) Continuation of application No. 16/021,998, filed on Jun. 28, 2018, now Pat. No. 10,510,419.

(51) Int. Cl.
*G11C 16/24* (2006.01)
*G11C 16/04* (2006.01)
*G11C 16/30* (2006.01)
*G11C 16/10* (2006.01)
*G11C 11/56* (2006.01)

(52) U.S. Cl.
CPC .......... *G11C 16/24* (2013.01); *G11C 16/0483* (2013.01); *G11C 16/10* (2013.01); *G11C 16/30* (2013.01); *G11C 11/5628* (2013.01); *G11C 11/5671* (2013.01)

(58) Field of Classification Search
None
See application file for complete search history.

(56) References Cited

U.S. PATENT DOCUMENTS

| | | |
|---|---|---|
| 10,510,419 B1 | 12/2019 | Yamada et al. |
| 2011/0019486 A1* | 1/2011 | Jang ................... G11C 16/0483 365/185.25 |
| 2020/0005876 A1 | 1/2020 | Yamada |

* cited by examiner

*Primary Examiner* — James G Norman
(74) *Attorney, Agent, or Firm* — Schwegman Lundberg & Woessner, P.A.

(57) ABSTRACT

Discussed herein are systems and methods for charging a bit line (BL) during programming of non-volatile memory cells. An embodiment of a memory device comprises a group of memory cells including a first memory cell coupled to a first BL and a second memory cell coupled to a second BL, and a BL charging circuit that provides an inhibit signal to the second BL in response to a control signal to program the first memory cell. To provide the inhibit signal, the BL charging circuit apply a supply voltage to the second BL for an initial wait time and, after the initial wait time, apply a higher voltage than the supply voltage, until the inhibit signal reaches a value of the supply voltage. The first memory cells is programmed in response to the established voltage on the second BL.

20 Claims, 11 Drawing Sheets

MONITORING AND CHARGING INHIBIT BIT-LINE

PRIORITY APPLICATIONS

This application is a continuation of U.S. application Ser. No. 16/021,998, filed Jun. 28, 2018, which is incorporated herein by reference in its entirety.

BACKGROUND

Flash memory is utilized as non-volatile memory for a wide range of electronic applications. Flash memory devices typically include one or more groups of one-transistor, floating gate or charge trap memory cells that allow for high memory densities, high reliability, and low power consumption Two common types of flash memory array architectures include NAND and NOR architectures, named after the logic form in which the basic memory cell configuration of each is arranged. The memory cells of the memory array are typically arranged in a matrix.

Traditional memory arrays are two-dimensional (2D) structures arranged on a surface of a semiconductor substrate. To increase memory capacity for a given area, and to decrease cost, the size of the individual memory cells has decreased. However, there is a technological limit to the reduction in size of the individual memory cells, and thus, to the memory density of 2D memory arrays. In response, three-dimensional (3D) memory structures, such as 3D NAND architecture semiconductor memory devices, are being developed to further increase memory density and lower memory cost.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
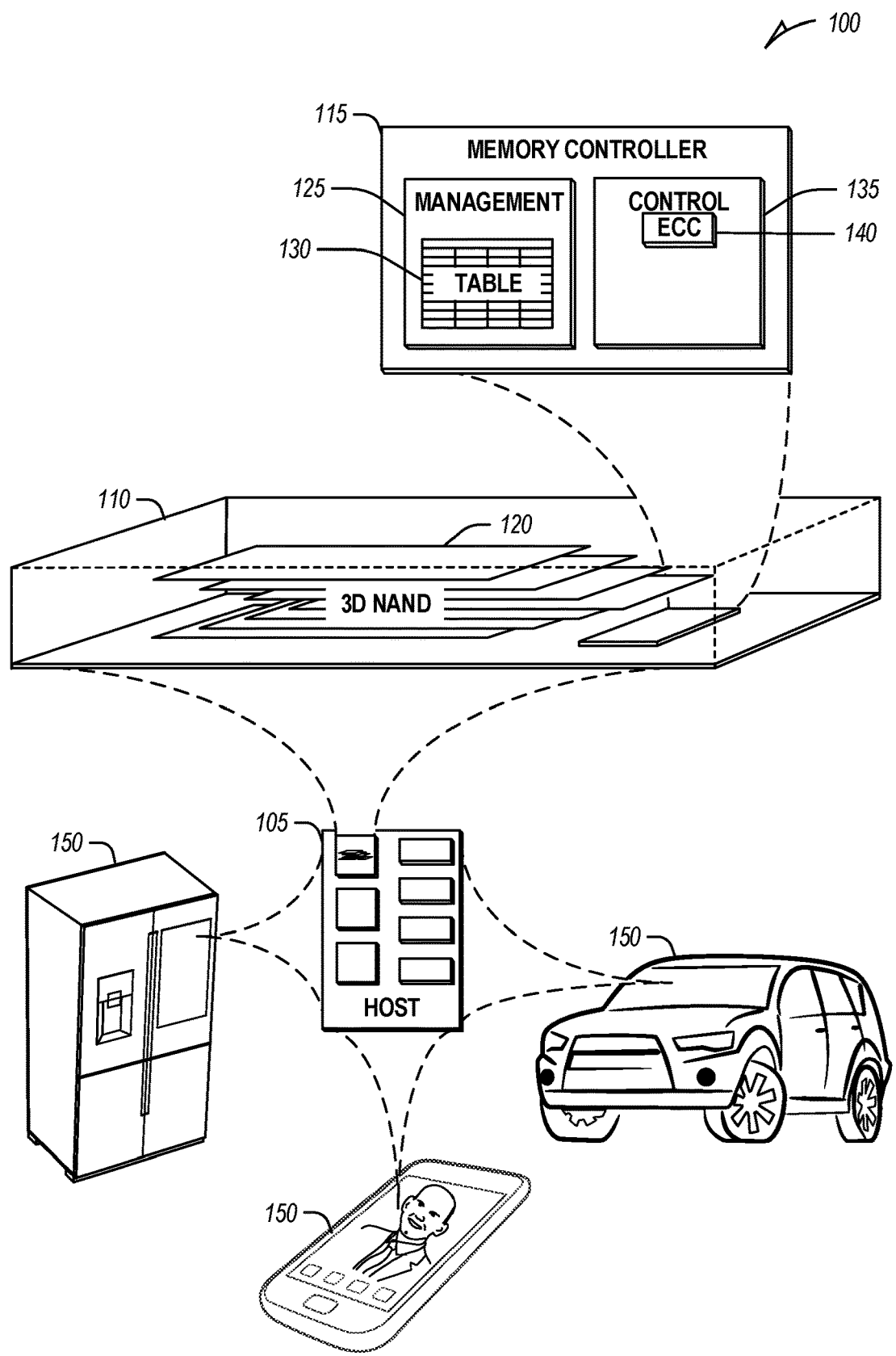
FIG. 1 illustrates an example of an environment including a memory device.

During a typical programming operation of a flash memory cell (e.g., a NAND flash memory), a selected word line (WL) coupled to the selected memory cell to be programmed is biased with a series of incrementing voltage programming pulses that start at an initial voltage that is greater than a predetermined programming voltage ($V_{PGM}$, e.g., approximately 16V, and up to 20V). The programming pulse increases a charge level, thereby increasing the cell threshold voltage Vt, on a floating gate of the memory cell. The programming operation may also involve applying a low potential (such as GND or Vss) to a bit line of a string of memory cells that include the target memory cell for programming (BL_pgm). However, low BL_pgm voltage, among other things, may cause source/drain channel potential to leak away (channel leakage), leading to significant program disturb (i.e., memory cells not targeted for being programmed nevertheless receive elevated voltage stress). As a result, the programming can be unstable and the program time ($t_{PROG}$) can be long.

To reduce $t_{PROG}$ and to prevent program disturb, BLs of the memory cells not targeted for programming (BL_inhibit) may be raised to a high voltage (e.g., $V_{CC}$) when programming a memory cell. The present inventor has recognized that reduction of $t_{PROG}$ may depend on fast and reliable BL charging process, as well as effective monitoring of BL_inhibit voltage. The present document provides solutions to the technological challenges of BL charging and monitoring which are required for more efficient programming operation. Among other things, the present document discusses an improved fast BL charging method to speed up the BL charging process to raise the BL_inhibit voltage to approximately $V_{CC}$. In an exemplary embodiment, a memory device may comprise an array of memory cells such as non-volatile memory cells, and a plurality of bit lines (BLs) that are coupled to the memory cells. The BLs include at least a first BL of selected memory cells for programming, and a second BL of unselected memory cells not targeted for programming. The memory device may further include a BL charging circuit to perform fast BL charging using a high-voltage (HV) source different from and higher than $V_{CC}$. The memory device includes a control circuit to enable fast BL charging using the HV source, while constantly or periodically monitoring the voltage on BL_inhibit. The established high BL_inhibit voltage may trigger the programming operation (e.g., application of $V_{PGM}$ to the WL of the selected memory cell). The devices and methods discussed herein may be advantageous to prevent leakage from the channel, reduce the programming time ($t_{PROG}$), and improve overall programming performance by avoiding unintended programming of non-selected memory cells.

In the following detailed description, reference is made to the accompanying drawings that form a part hereof and in which is shown, by way of illustration, specific embodiments. In the drawings, like numerals describe substantially similar components throughout the several views. Other embodiments may be utilized and structural, logical, and electrical changes may be made without departing from the scope of the present disclosure. The following detailed description is, therefore, not to be taken in a limiting sense.

FIG. 1 illustrates an example of an environment 100 including a host device 105 and a memory device 110 configured to communicate over a communication interface. The host device 105 or the memory device 110 may be included in a variety of products 150, such as Internet of Things (IoT) devices (e.g., a refrigerator or other appliance, sensor, motor or actuator, mobile communication device, automobile, drone, etc.) to support processing, communications, or control of the product 150.

The memory device 110 includes a memory controller 115 and a memory array 120. The memory array 120 may include a number of individual memory die (e.g., a two-dimensional (2D) NAND die, or a stack of three-dimensional (3D) NAND die). Traditionally, the memory arrays 120 are two-dimensional (2D) structures arranged on a surface of a semiconductor substrate. To increase memory capacity for a given area, and to decrease cost, the size of the individual memory cells has decreased. However, there is a technological limit to the reduction in size of the individual memory cells, and thus, to the memory density of 2D memory arrays. In response, three-dimensional (3D) memory structures, such as 3D NAND architecture semiconductor memory devices, are being developed to further increase memory density and lower memory cost.

Such 3D NAND devices often include strings of storage cells, coupled in series (e.g., drain to source), between one or more source-side select gates (SGSs) proximate a source, and one or more drain-side select gates (SGDs) proximate a bit line. In an example, the SGSs or the SGDs can include one or more field-effect transistors (FETs) or metal-oxide semiconductor (MOS) structure devices, etc. In some examples, the strings will extend vertically, through multiple vertically spaced tiers containing respective word lines. A semiconductor structure (e.g., a polysilicon structure) may extend adjacent a string of storage cells to form a channel for the storages cells of the string. In the example of a vertical string, the polysilicon structure may be in the form of a vertically extending pillar. In some examples the string may be "folded," and thus arranged relative to a U-shaped pillar. In other examples, multiple vertical structures may be stacked upon one another to form stacked arrays of storage cell strings.

In 3D architecture semiconductor memory technology, vertical structures are stacked, increasing the number of tiers, physical pages, and accordingly, the density of a memory device (e.g., a storage device). In an example, the memory device 110 can be a discrete memory or storage device component of the host device 105. In other examples, the memory device 110 can be a portion of an integrated circuit (e.g., system on a chip (SOC), etc.), stacked or otherwise included with one or more other components of the host device 105.

One or more communication interfaces can be used to transfer data between the memory device 110 and one or more other components of the host device 105, such as a Serial Advanced Technology Attachment (SATA) interface, a Peripheral Component Interconnect Express (PCIe) interface, a Universal Serial Bus (USB) interface, a Universal Flash Storage (UFS) interface, an eMMC™ interface, or one or more other connectors or interfaces. The host device 105 can include a host system, an electronic device, a processor, a memory card reader, or one or more other electronic devices external to the memory device 110.

The memory controller 115 can receive instructions from the host 105, and can communicate with the memory array, such as to transfer data to (e.g., write or erase) or from (e.g., read) one or more of the memory cells, planes, sub-blocks, blocks, or pages of the memory array. The memory controller 115 can include, among other things, circuitry or firmware, including one or more components or integrated circuits. For example, the memory controller 115 can include one or more memory control units, circuits, or components configured to control access across the memory array 120 and to provide a translation layer between the host 105 and the memory device 110. The memory controller 115 can include one or more input/output (I/O) circuits, lines, or interfaces to transfer data to or from the memory array 120. The memory controller 115 can include a memory manager 125 and an array controller 135.

The memory manager 125 can include, among other things, circuitry or firmware, such as a number of components or integrated circuits associated with various memory management functions. For purposes of the present description example memory operation and management functions will be described in the context of NAND memory. Persons skilled in the art will recognize that other forms of non-volatile memory may have analogous memory operations or management functions. Such NAND management functions include wear leveling (e.g., garbage collection or reclamation), error detection or correction, block retirement, or one or more other memory management functions. The memory manager 125 can parse or format host commands (e.g., commands received from a host) into device commands (e.g., commands associated with operation of a memory array, etc.), or generate device commands (e.g., to accomplish various memory management functions) for the array controller 135 or one or more other components of the memory device 110.

The memory manager 125 can include a set of management tables 130 configured to maintain various information associated with one or more component of the memory device 110 (e.g., various information associated with a memory array or one or more memory cells coupled to the memory controller 115). For example, the management tables 130 can include information regarding block age, block erase count, error history, or one or more error counts (e.g., a write operation error count, a read bit error count, a read operation error count, an erase error count, etc.) for one or more blocks of memory cells coupled to the memory controller 115. In certain examples, if the number of detected errors for one or more of the error counts is above a threshold, the bit error can be referred to as an uncorrectable bit error. The management tables 130 can maintain a count of correctable or uncorrectable bit errors, among other things.

The array controller 135 can include, among other things, circuitry or components configured to control memory operations associated with writing data to, reading data from, or erasing one or more memory cells of the memory device 110 coupled to the memory controller 115. The memory operations can be based on, for example, host commands received from the host 105, or internally generated by the memory manager 125 (e.g., in association with wear leveling, error detection or correction, etc.).

The array controller 135 can include an error correction code (ECC) component 140, which can include, among other things, an ECC engine or other circuitry configured to detect or correct errors associated with writing data to or reading data from one or more memory cells of the memory device 110 coupled to the memory controller 115. The memory controller 115 can be configured to actively detect and recover from error occurrences (e.g., bit errors, operation errors, etc.) associated with various operations or storage of data, while maintaining integrity of the data transferred between the host 105 and the memory device 110, or maintaining integrity of stored data (e.g., using redundant RAID storage, etc.), and can remove (e.g., retire) failing memory resources (e.g., memory cells, memory arrays, pages, blocks, etc.) to prevent future errors.

In some examples, the memory array may comprise a number of NAND dies and one or more functions of the memory controller 115 for a particular NAND die may be implemented on an on-die controller on that particular die. Other organizations and delineations of control functionality may also be utilized, such as a controller for each die, plane, superblock, block, page, and the like.

The memory array 120 can include several memory cells arranged in, for example, a number of devices, semi-conductor dies, planes, sub-blocks, blocks, or pages. As one example, a 48 GB TLC NAND memory device can include 18,592 bytes (B) of data per page (16,384+2208 bytes), 1536 pages per block, 548 blocks per plane, and 4 or more planes per device. As another example, a 32 GB MLC memory device (storing two bits of data per cell (i.e., 4 programmable states)) can include 18,592 bytes (B) of data per page (16,384+2208 bytes), 1024 pages per block, 548 blocks per plane, and 4 planes per device, but with half the required write time and twice the program/erase (P/E) cycles as a corresponding TLC memory device. Other examples can include other numbers or arrangements. In some examples, a memory device, or a portion thereof, may be selectively operated in SLC mode, or in a desired MLC mode (such as TLC, QLC, etc.).

In operation, data is typically written to or read from the NAND memory device 110 in pages, and erased in blocks. However, one or more memory operations (e.g., read, write, erase, etc.) can be performed on larger or smaller groups of memory cells, as desired. The data transfer size of a NAND memory device 110 is typically referred to as a page, whereas the data transfer size of a host is typically referred to as a sector.

Although a page of data can include a number of bytes of user data (e.g., a data payload including a number of sectors of data) and its corresponding metadata, the size of the page often refers only to the number of bytes used to store the user data. As an example, a page of data having a page size of 4 KB may include 4 KB of user data (e.g., 8 sectors assuming a sector size of 512 B) as well as a number of bytes (e.g., 32 B, 54 B, 224 B, etc.) of metadata corresponding to the user data, such as integrity data (e.g., error detecting or correcting code data), address data (e.g., logical address data, etc.), or other metadata associated with the user data.

Different types of memory cells or memory arrays 120 can provide for different page sizes, or may require different amounts of metadata associated therewith. For example, different memory device types may have different bit error rates, which can lead to different amounts of metadata necessary to ensure integrity of the page of data (e.g., a memory device with a higher bit error rate may require more bytes of error correction code data than a memory device with a lower bit error rate). As an example, a multi-level cell (MLC) NAND flash device may have a higher bit error rate than a corresponding single-level cell (SLC) NAND flash device. As such, the MLC device may require more metadata bytes for error data than the corresponding SLC device.

Figure 2:
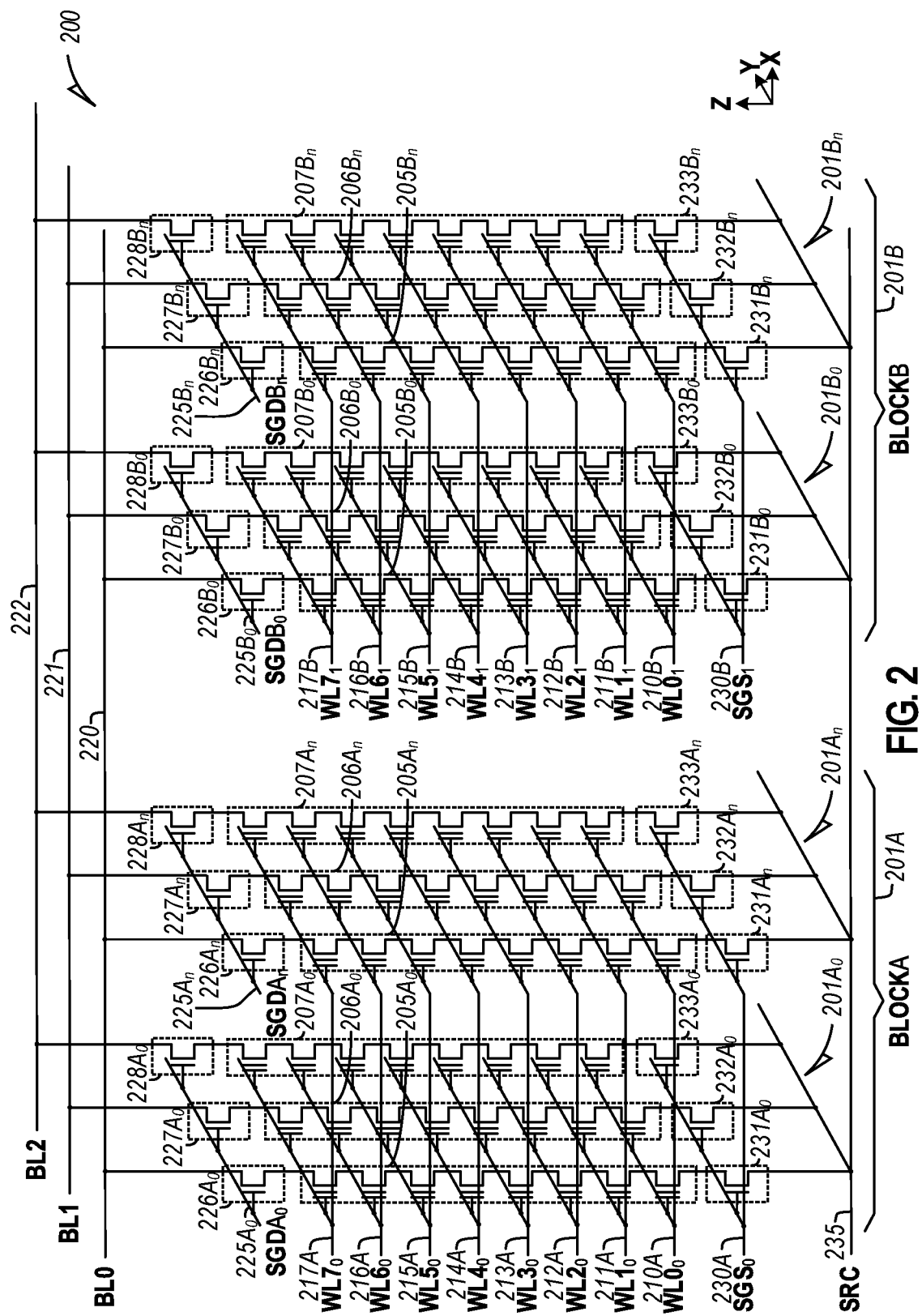
FIGS. 2-3 are schematic diagrams illustrating examples of NAND architecture semiconductor memory array.

FIG. 2 is a schematic diagram illustrating an example of a 3D NAND architecture semiconductor memory array 200 including a number of strings of memory cells (e.g., first-third $A_0$ memory strings $205A_0$-$207A_0$, first-third $A_n$ memory strings $205A_n$-$207A_n$, first-third $B_0$ memory strings $205B_0$-$207B_0$, first-third $B_n$ memory strings $205B_n$-$207B_n$, etc.), organized in blocks (e.g., block A 201A, block B 201B, etc.) and sub-blocks (e.g., sub-block $A_0$ $201A_0$, sub-block $A_n$ $201A_n$, sub-block $B_0$ $201B_0$, sub-block $B_n$ $201B_n$, etc.). The memory array 200 represents a portion of a greater number of similar structures that would typically be found in a block, device, or other unit of a memory device.

Each string of memory cells includes a number of tiers of charge storage transistors (e.g., floating gate transistors, charge-trapping structures, etc.) stacked in the Z direction, source to drain, between a source line (SRC) 235 or a source-side select gate (SGS) (e.g., first-third $A_0$ SGS $231A_0$-$233A_0$, first-third $A_n$ SGS $231A_n$-$233A_n$, first-third $B_0$ SGS $231B_0$-$233B_0$, first-third $B_n$ SGS $231B_n$-$233B_n$, etc.) and a drain-side select gate (SGD) (e.g., first-third $A_0$ SGD $226A_0$-$228A_0$, first-third $A_n$ SGD $226A_n$-$228A_n$, first-third $B_0$ SGD $226B_0$-$228B_0$, first-third $B_n$ SGD $226B_n$-$228B_n$, etc.). Each string of memory cells in the 3D memory array can be arranged along the X direction as data lines (e.g., bit lines (BL) BL0-BL2 220-222), and along the Y direction as physical pages.

Within a physical page, each tier represents a row of memory cells, and each string of memory cells represents a column. A sub-block can include one or more physical pages. A block can include a number of sub-blocks (or physical pages) (e.g., 128, 256, 384, etc.). Although illustrated herein as having two blocks, each block having two sub-blocks, each sub-block having a single physical page, each physical page having three strings of memory cells, and each string having 8 tiers of memory cells, in other examples, the memory array 200 can include more or fewer blocks, sub-blocks, physical pages, strings of memory cells, memory cells, or tiers. For example, each string of memory cells can include more or fewer tiers (e.g., 16, 32, 64, 128, etc.), as well as one or more additional tiers of semiconductor material above or below the charge storage transistors (e.g., select gates, data lines, etc.), as desired. As an example, a 48 GB TLC NAND memory device can include 18,592 bytes (B) of data per page (16,384+2208 bytes), 1536 pages per block, 548 blocks per plane, and 4 or more planes per device.

Each memory cell in the memory array 200 includes a control gate (CG) coupled to (e.g., electrically or otherwise operatively connected to) an access line (e.g., word lines (WL) $WL0_0$-$WL7_0$ 210A-217A, $WL0_1$-$WL7_1$ 210B-217B, etc.), which collectively couples the control gates (CGs) across a specific tier, or a portion of a tier, as desired. Specific tiers in the 3D memory array, and accordingly, specific memory cells in a string, can be accessed or controlled using respective access lines. Groups of select gates can be accessed using various select lines. For example, first-third $A_0$ SGD $226A_0$-$228A_0$ can be accessed using an $A_0$ SGD line $SGDA_0$ $225A_0$, first-third $A_n$ SGD $226A_n$-$228A_n$ can be accessed using an $A_n$ SGD line $SGDA_n$ $225A_n$, first-third $B_0$ SGD $226B_0$-$228B_0$ can be accessed using an $B_0$ SGD line $SGDB_0$ $225B_0$, and first-third $B_n$ SGD $226B_n$-$228B_n$ can be accessed using an $B_n$ SGD line $SGDB_n$ $225B_n$. First-third $A_0$ SGS $231A_0$-$233A_0$ and first-third $A_n$ SGS $231A_n$-$233A_0$ can be accessed using a gate select line $SGS_0$ 230A, and first-third $B_0$ SGS $231B_0$-$233B_0$ and first-third $B_n$ SGS $231B_n$-$233B_n$ can be accessed using a gate select line $SGS_1$ 230B.

In an example, the memory array 200 can include a number of levels of semiconductor material (e.g., polysilicon, etc.) configured to couple the control gates (CGs) of each memory cell or select gate (or a portion of the CGs or select gates) of a respective tier of the array. Specific strings of memory cells in the array can be accessed, selected, or controlled using a combination of bit lines (BLs) and select gates, etc., and specific memory cells at one or more tiers in the specific strings can be accessed, selected, or controlled using one or more access lines (e.g., word lines).

Figure 3:
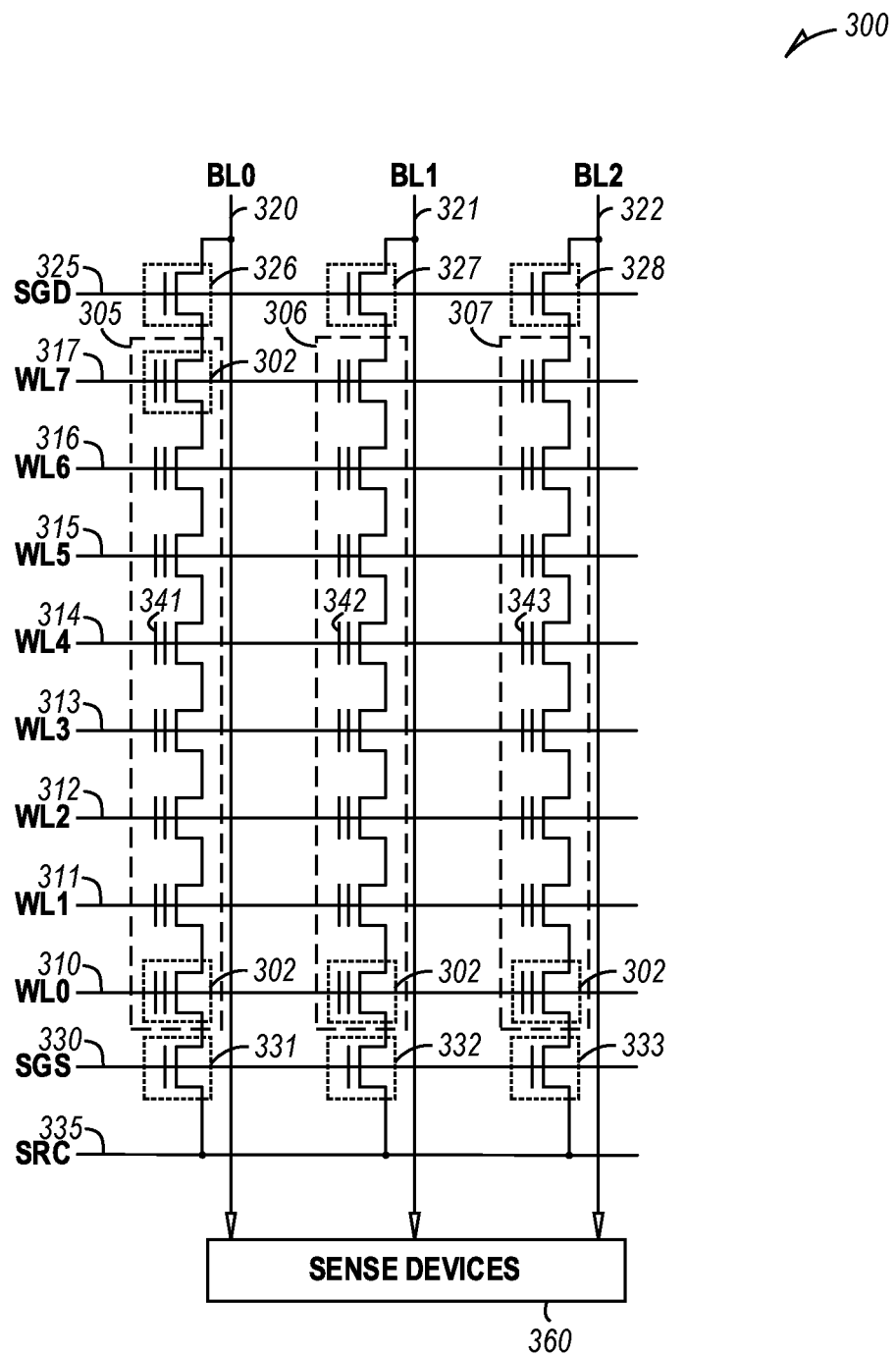

FIG. 3 illustrates an example schematic diagram of a portion of a NAND architecture semiconductor memory array 300 including a plurality of memory cells 302 arranged in a two-dimensional array of strings (e.g., first-third strings 305-307) and tiers (e.g., illustrated as respective word lines (WL) WL0-WL7 310-317, a drain-side select gate (SGD) line 325, a source-side select gate (SGS) line 330, etc.), and sense amplifiers or devices 360. For example, the memory array 300 can illustrate an example schematic diagram of a portion of one physical page of memory cells of a 3D NAND architecture semiconductor memory device, such as illustrated in FIG. 2.

Each string of memory cells is coupled to a source line (SRC) using a respective source-side select gate (SGS) (e.g., first-third SGS 331-333), and to a respective data line (e.g., first-third bit lines (BL) BL0-BL2 320-322) using a respective drain-side select gate (SGD) (e.g., first-third SGD 326-328). Although illustrated with 8 tiers (e.g., using word lines (WL) WL0-WL7 310-317) and three data lines (BL0-BL2 326-328) in the example of FIG. 3, other examples can include strings of memory cells having more or fewer tiers or data lines, as desired.

In a NAND architecture semiconductor memory array, such as the example memory array 300, the state of a selected memory cell 302 can be accessed by sensing a current or voltage variation associated with a particular data line containing the selected memory cell. The memory array 300 can be accessed (e.g., by a control circuit, one or more processors, digital logic, etc.) using one or more drivers. In an example, one or more drivers can activate a specific memory cell, or set of memory cells, by driving a particular potential to one or more data lines (e.g., bit lines BL0-BL2), access lines (e.g., word lines WL0-WL7), or select gates, depending on the type of operation desired to be performed on the specific memory cell or set of memory cells.

To program or write data to a memory cell, a programming voltage (Vpgm) (e.g., one or more programming pulses, etc.) can be applied to selected word lines (e.g., WL4), and thus, to a control gate of each memory cell coupled to the selected word lines (e.g., first-third control gates (CGs) 341-343 of the memory cells coupled to WL4). Programming pulses can begin, for example, at or near 15V and, in certain examples, can increase in magnitude during each programming pulse application. While the program voltage is applied to the selected word lines, a potential, such as a ground potential (e.g., Vss), can be applied to the data lines (e.g., bit lines) and substrates (and thus the channels, between the sources and drains) of the memory cells targeted for programming, resulting in a charge transfer (e.g., direct injection or Fowler-Nordheim (FN) tunneling, etc.) from the channels to the floating gates of the targeted memory cells.

In contrast, a pass voltage (Vpass) can be applied to one or more word lines having memory cells that are not targeted for programming, or an inhibit voltage (e.g., $V_{CC}$) can be applied to data lines (e.g., bit lines) having memory cells that are not targeted for programming, for example, to inhibit charge from being transferred from the channels to the floating gates of such non-targeted memory cells. The pass voltage can be variable, depending, for example, on the proximity of the applied pass voltages to a word line targeted for programming. The inhibit voltage can include a supply voltage ($V_{CC}$), such as a voltage from an external source or supply (e.g., a battery, an AC-to-DC converter, etc.), relative to a ground potential (e.g., $V_{SS}$).

As an example, if a programming voltage (e.g., 15V or more) is applied to a specific word line, such as WL4, a pass voltage of 10V can be applied to one or more other word lines, such as WL3, WL5, etc., to inhibit programming of non-targeted memory cells, or to retain the values stored on such memory cells not targeted for programming. As the distance between an applied program voltage and the non-targeted memory cells increases, the pass voltage required to refrain from programming the non-targeted memory cells can decrease. For example, where a programming voltage of 15V is applied to WL4, a pass voltage of 10V can be applied to WL3 and WL5, a pass voltage of 8V can be applied to WL2 and WL6, a pass voltage of 7V can be applied to WL1 and WL7, etc. In other examples, the pass voltages, or number of word lines, etc., can be higher or lower, or more or less.

The sense amplifiers 360, coupled to one or more of the data lines (e.g., first, second, or third bit lines (BL0-BL2) 320-322), can detect the state of each memory cell in respective data lines by sensing a voltage or current on a particular data line.

Between applications of one or more programming pulses (e.g., Vpgm), a verify operation can be performed to determine if a selected memory cell has reached its intended programmed state. If the selected memory cell has reached its intended programmed state, it can be inhibited from further programming. If the selected memory cell has not reached its intended programmed state, additional programming pulses can be applied. If the selected memory cell has not reached its intended programmed state after a particular number of programming pulses (e.g., a maximum number), the selected memory cell, or a string, block, or page associated with such selected memory cell, can be marked as defective.

To erase a memory cell or a group of memory cells (e.g., erasure is typically performed in blocks or sub-blocks), an erasure voltage (Vers) (e.g., typically Vpgm) can be applied to the substrates (and thus the channels, between the sources and drains) of the memory cells targeted for erasure (e.g., using one or more bit lines, select gates, etc.), while the word lines of the targeted memory cells are kept at a potential, such as a ground potential (e.g., Vss), resulting in a charge transfer (e.g., direct injection or Fowler-Nordheim (FN) tunneling, etc.) from the floating gates of the targeted memory cells to the channels.

Figure 4:
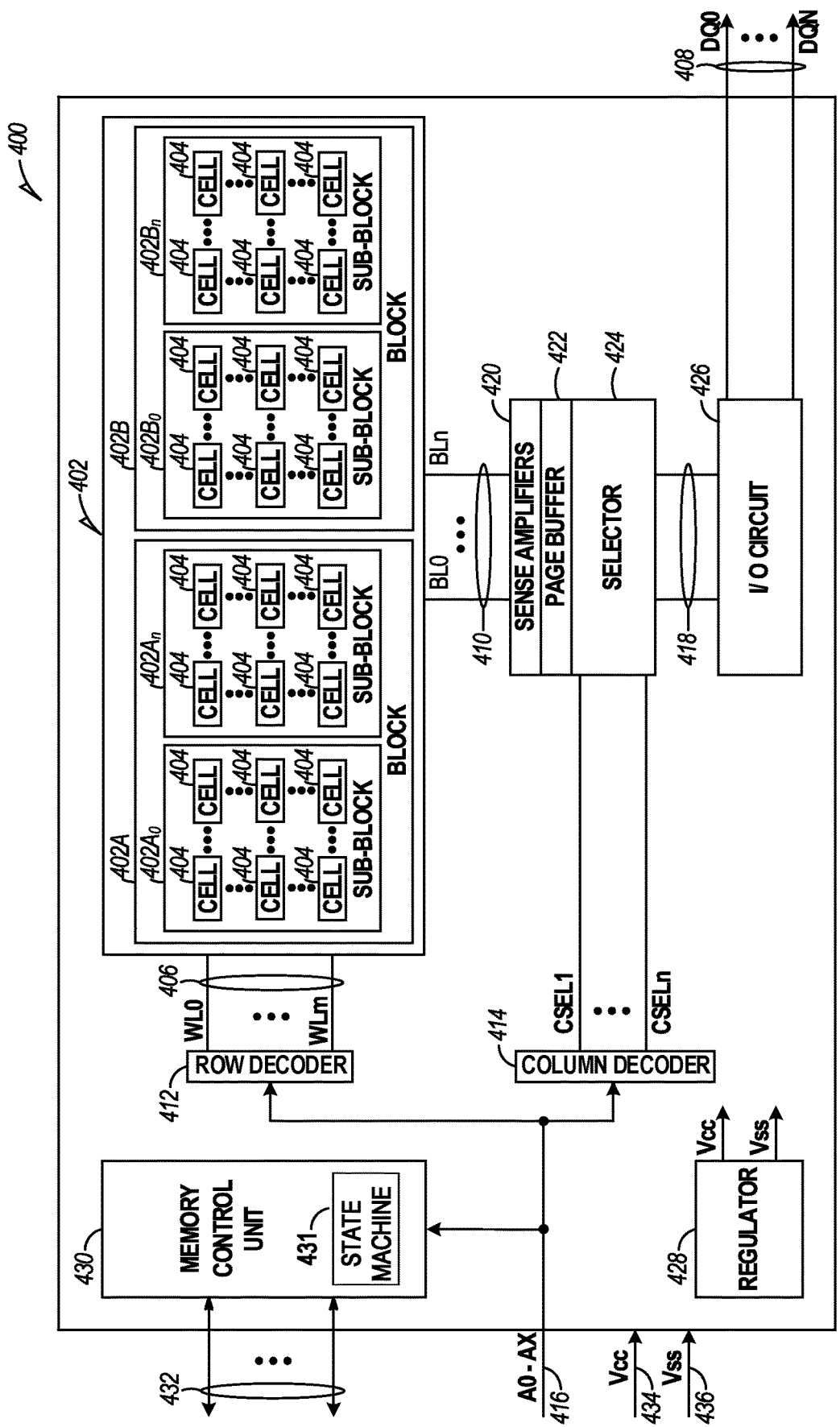
FIG. 4 is a block diagram illustrating an example of a memory module.

FIG. 4 is a block diagram illustrating an example of a memory device 400 including a memory array 402 having a plurality of memory cells 404, and one or more circuits or components to provide communication with, or perform one or more memory operations on, the memory array 402. The memory device 400 can include a row decoder 412, a column decoder 414, sense amplifiers 420, a page buffer 422, a selector 424, an input/output (I/O) circuit 426, and a memory control unit 430.

The memory cells 404 of the memory array 402 can be arranged in blocks, such as first and second blocks 402A, 402B. Each block can include sub-blocks. For example, the first block 402A can include first and second sub-blocks 402A$_0$, 402A$_n$, and the second block 402B can include first and second sub-blocks 402B$_0$, 402B$_n$. Each sub-block can include a number of physical pages, each page including a number of memory cells 404. Although illustrated herein as having two blocks, each block having two sub-blocks, and each sub-block having a number of memory cells 404, in other examples, the memory array 402 can include more or fewer blocks, sub-blocks, memory cells, etc. In other examples, the memory cells 404 can be arranged in a number of rows, columns, pages, sub-blocks, blocks, etc., and accessed using, for example, access lines 406, first data lines 410, or one or more select gates, source lines, etc.

The memory control unit 430 can control memory operations of the memory device 400 according to one or more signals or instructions received on control lines 432, including, for example, one or more clock signals or control signals that indicate a desired operation (e.g., write, read, erase, etc.), or address signals (A0-AX) received on one or more address lines 416. One or more devices external to the memory device 400 can control the values of the control signals on the control lines 432, or the address signals on the address line 416. Examples of devices external to the memory device 400 can include, but are not limited to, a host, a memory controller, a processor, or one or more circuits or components not illustrated in FIG. 4.

The memory device 400 can use access lines 406 and first data lines 410 to transfer data to (e.g., write or erase) or from (e.g., read) one or more of the memory cells 404. The memory control unit 430 may include a state machine 431 coupled to the row decoder 412, the column decoder 414, and the I/O circuit 426. The state machine 413 can also output status data of the flash memory such as READY/BUSY or PASS/FAIL. In some designs, the state machine 413 can be configured to manage the programming process. The row decoder 412 and the column decoder 414 can receive and decode the address signals (A0-AX) from the address line 416, determine which of the memory cells 404 are to be accessed, and provide signals to one or more of the access lines 406 (e.g., one or more of a plurality of word lines (WL0-WLm)) or the first data lines 410 (e.g., one or more of a plurality of bit lines (BL0-BLn)), such as described above.

The memory device 400 can include sense circuitry, such as the sense amplifiers 420, configured to determine the values of data on (e.g., read), or to determine the values of data to be written to, the memory cells 404 using the first data lines 410. For example, in a selected string of memory cells 404, one or more of the sense amplifiers 420 can read a logic level in the selected memory cell 404 in response to a read current flowing in the memory array 402 through the selected string to the data lines 410.

One or more devices external to the memory device 400 can communicate with the memory device 400 using the I/O lines (DQ0-DQN) 408, address lines 416 (A0-AX), or control lines 432. The input/output (I/O) circuit 426 can transfer values of data in or out of the memory device 400, such as in or out of the page buffer 422 or the memory array 402, using the I/O lines 408, according to, for example, the control lines 432 and address lines 416. The page buffer 422 can store data received from the one or more devices external to the memory device 400 before the data is programmed into relevant portions of the memory array 402, or can store data read from the memory array 402 before the data is transmitted to the one or more devices external to the memory device 400.

The column decoder 414 can receive and decode address signals (A0-AX) into one or more column select signals (CSEL1-CSELn). The selector 424 (e.g., a select circuit) can receive the column select signals (CSEL1-CSELn) and select data in the page buffer 422 representing values of data to be read from or to be programmed into memory cells 404. Selected data can be transferred between the page buffer 422 and the I/O circuit 426 using second data lines 418.

The memory control unit 430 can receive positive and negative supply signals, such as a supply voltage ($V_{CC}$) 434 and a negative supply ($V_{SS}$) 436 (e.g., a ground potential), from an external source or supply (e.g., an internal or external battery, an AC-to-DC converter, etc.). In certain examples, the memory control unit 430 can include a regulator 428 to internally provide positive or negative supply signals.

In programming operation of memory cells, a short programming time ($t_{PROG}$) is generally desired. Reduction of $t_{PROG}$ may depend on fast and reliable BL charging process, as well as effective monitoring of BL_inhibit voltage. Application of an inhibit voltage of approximately $V_{CC}$ to the data lines BL_inhibit having non-target memory cells (i.e., memory cells not to be programmed) has been used to inhibit charge from being transferred from the channels to the floating gates of such non-targeted memory cells, thus avoiding or reduce program disturb. Nonetheless, there are certain circumstances in which faster and more reliable programming process is desired. For example, the present inventor has recognized that it may take significant amount of time to charge up a BL_inhibit to a target inhibit voltage of approximately $V_{CC}$ when the voltage source used for charging is also $V_{CC}$. Additionally, more effective monitoring is desired to detect that the BL_inhibit has reached a desired inhibit voltage level. Various examples discussed below, such as with reference to FIGS. 5-7, may reduce the programming time ($t_{PROG}$), prevent leakage from the channel, and improve overall programming performance by avoiding unintended programming of non-selected memory cells.

Figure 5:
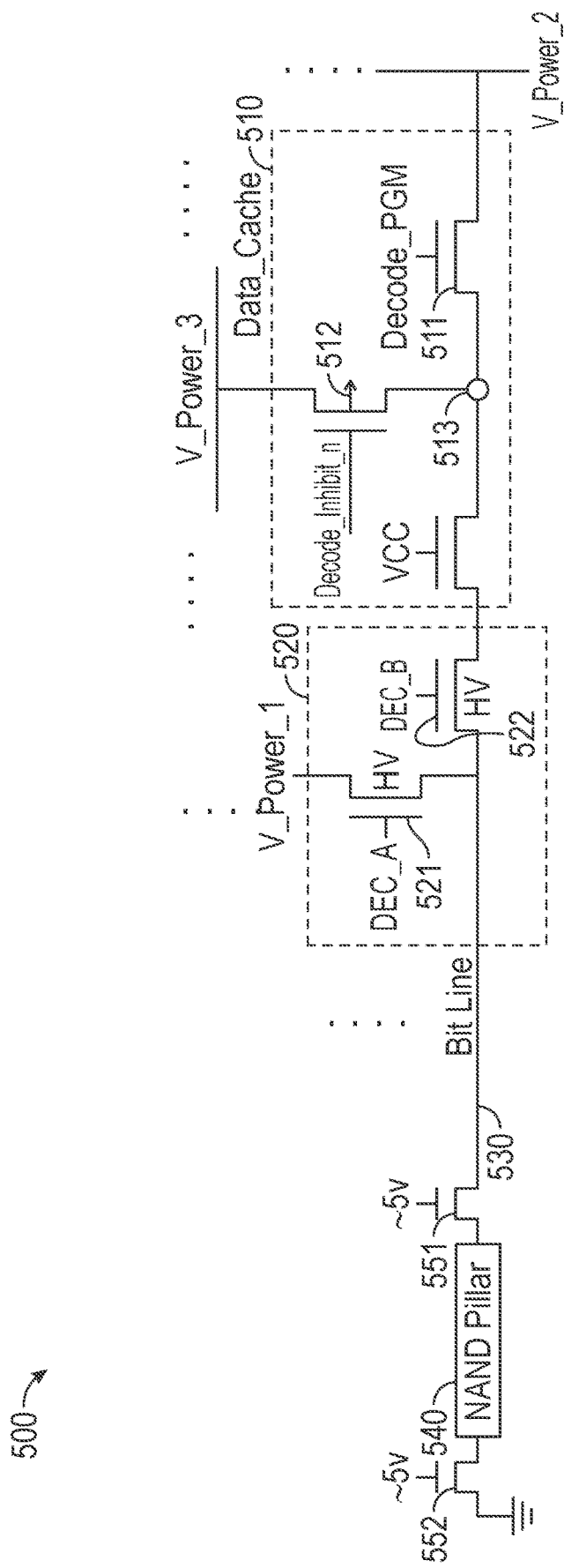
FIG. 5 is a schematic diagram illustrating an example of a bit line (BL) monitor circuit configured to detect potential on a BL.

FIG. 5 is a schematic diagram illustrating an example of a bit line (BL) monitor circuit 500 configured to monitor potential on a BL 530. The BL monitor circuit 500 includes a data cache 510 and a multiplexer (MUX) 520. The data cache 510 is configured to decode BL voltage on the BL 530. The BL 530 is connected to a NAND pillar 540 consisting of a plurality of series-connected stacked NAND transistors via a drain-side select gate (SGD) 551 and a source-side select gate (SGS) 552. The MUX 520 can be configured to select between a charge mode to raise the voltage on the BL 530 by turning on a first switch/transistor 521, and a monitor mode to monitor voltage on the BL 530 by turning on a second switch/transistor 522.

As discussed above (such as with reference to FIG. 3), programming data to a memory cell (e.g., a NAND flash memory) typically involves applying a high positive programming voltage $V_{PGM}$ (typically 16V, and up to 20V) to the WLs in communication with the control gates of the target memory cells for programming (WL_pgm), and applying a low potential (such as GND or Vss) to the BLs of the target memory cells for programming (BL_pgm) and the source/drain channel. The high WL_pgm voltage and the low BL_pgm voltage of the selected cell may cause charge transfer from the BL (channel) to the floating gates of the targets memory cells via direct injection, or other mechanism such as Fowler-Nordheim (FN) tunneling. A pass voltage ($V_{PASS}$), typically in a range of 9V-10V, may be applied to the WLs in communication with the control gates of the non-target memory cells, i.e., the memory cells not targeted for programming (WL_inhibit).

The BL 530 may be put at a low voltage (e.g., 0V) or a high voltage (e.g., $V_{CC}$), depending on whether the memory cells in the NAND pillar 530 are to be programmed or inhibited. When one or more memory cells in the NAND pillar 541 are to be programmed, the corresponding BL 530 is referred to as BL_pgm. When the memory cells in the NAND pillar 541 are to be inhibited (not targeted for programming), the corresponding BL 530 is referred to as BL_inhibit.

Conventionally, programming operation (e.g., raising the voltage on the WL of the target memory cells for programming) is triggered by an established low voltage on BL_pgm. This voltage may be monitored using the data cache 510, which includes a switch/transistor 511 to decode BL voltage on the BL 530. In an example, the switch/transistor 511 is a NMOS transistor. Other types of FET or MOS devices may be used. When the control signal "Decode_PGM" at the control gate is set to high, the switch/transistor 511 is turned on, and the BL voltage at node 513 may be monitored at a detecting point V_power_2. When V_power_2 satisfies a specified condition such as falling below a threshold voltage $V_{T1}$, BL_pgm is deemed low (e.g., approximately 0V), and the programming operation may commence, such as by raising the voltage on the WLs in communication with the memory cells in the NAND pillar 530.

The drain-side select gate (SGD) 551 plays a role of selecting or deselecting the NAND pillars 540 coupled to the BL 530. In order to unselect a NAND pillar correctly, the SGD 551 needs to be set to a low voltage. However, very low voltage on SGD 551 may cause a number of issues, including low and unstable SGD threshold Vth, hence a poor cut-off margin. The low voltage (e.g., approximately 0V) on BL_pgm cannot be effectively transmitted inside a NAND pillar. The combination of low BL voltage and the low Vth of SGD 551 may cause the channel potential to leak away (channel leakage), leading to significant program disturb, such that one or more non-target memory cells (those not to be programmed) nevertheless receive elevated voltage stress.

To prevent channel leakage and program disturb, it is desired to set BL_inhibit at a high-voltage level when programming a memory cell. Because of the poor cut-off margin of the SGD 551 that may cause channel leakage, it is desired to charge the BL_inhibit up to a high-voltage level approximately equal to $V_{CC}$ to mitigate channel leakage. The established high voltage on BL_inhibit may be used to trigger the programming operation.

The voltage on BL_inhibit may be monitored by the data cache 510, which includes a switch/transistor 512 configured to decode BL voltage on the BL 530. In an example, the switch/transistor 512 is a PMOS transistor. Other types of FET or MOS devices may be used. When the switch/transistor 512 is turned on, the BL voltage at node 513 may be monitored at detecting point V_power_3 different from the detecting point V_power_2. When V_power_3 satisfies a specified condition such as exceeding a threshold voltage $V_{T2}$, BL_inhibit is deemed high (e.g., at or close to $V_{CC}$), and the programming operation may commence.

Compared to monitoring (via V_power_2) and triggering programming operation using the established low voltage on BL_pgm as discussed above, monitoring BL_inhibit voltage (via V_power_3) and use that voltage to trigger programming operation as discussed herein may reduce program disturb and thus improve programming reliability. Establishing and maintaining a high BL_inhibit voltage may be advantageous to prevent leakage from the channel, reduce program disturb on non-target memory cells, and improve overall programming performance.

Figure 6:
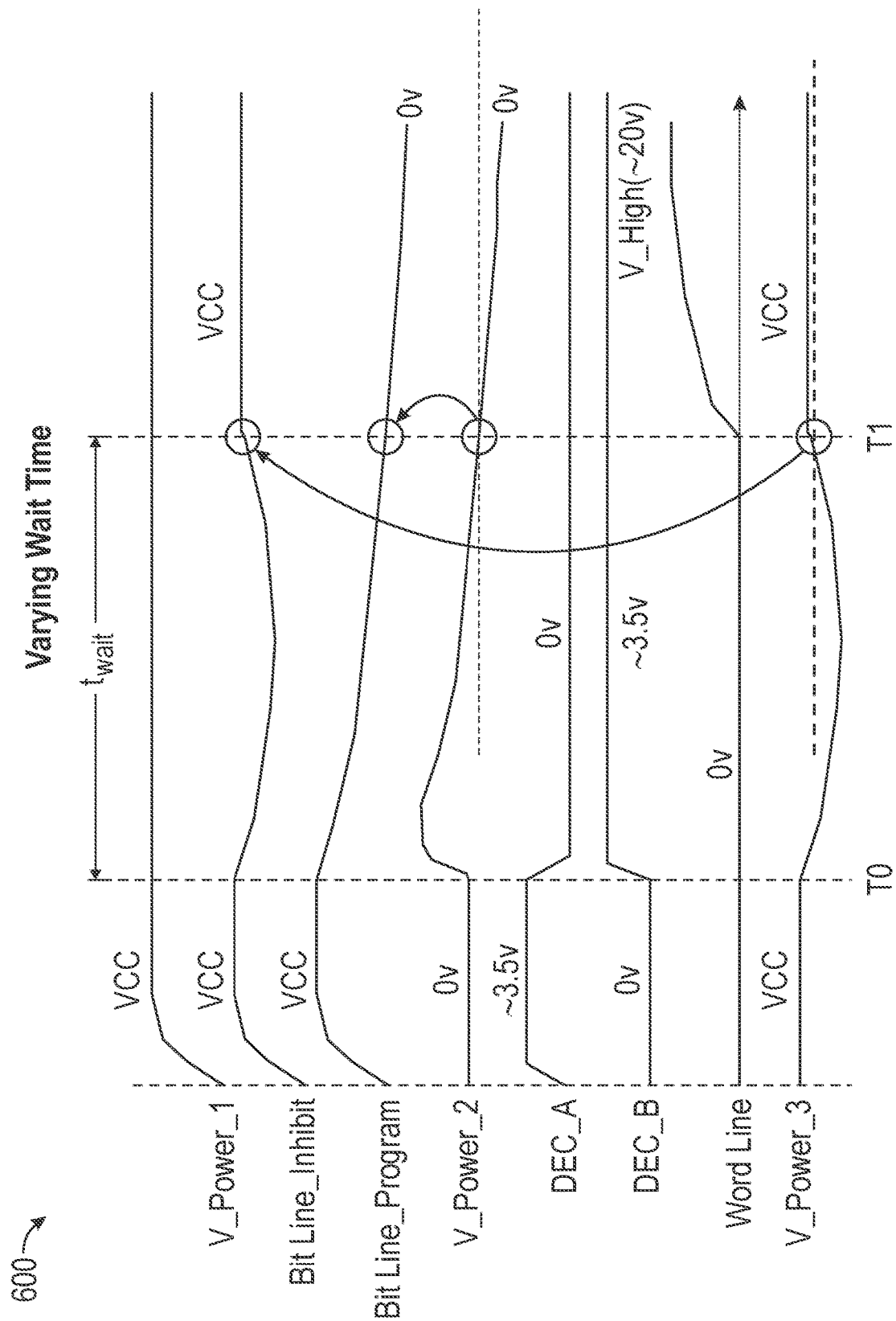
FIG. 6 is a timing diagram illustrating event sequence when monitoring BL voltage using the BL monitor circuit as depicted in FIG. 5.

FIG. 6 is a timing diagram illustrating event sequence when monitoring BL voltage using the BL monitor circuit 500. A pre-programmed warm-up period $t_{wait}$ starts at time T0, when the BL charging switch/transistor 521 is turned off and the BL voltage sensing switch 522 is turned on. As a low voltage (GND or $V_{SS}$) is applied to BL_pgm causing a decrease in voltage on BL_pgm, BL_inhibit may also drop significantly due to the inter-BL coupling.

The wait time $t_{wait}$ can be variable, depending on total BL capacitance and data patterns. Generally, the wait time is the longest in the first program pulse, whereas it is the shortest in the last program pulse. This is because in the first pulse, a substantial number of BLs (e.g., more than 50%) have not yet to be programmed; therefore, the total BL capacitance is the largest at least due to high inter-BL coupling capacitance. In the last pulse, because most of the BLs have been already programmed, the total BL capacitance is the smallest at least due to small inter-BL coupling capacitance.

Programming operation may be triggered by established low voltage on BL_pgm, and/or high voltage on BL_inhibit. Low BL_pgm voltage may be detected from the detecting point V_power_2. At T1, voltage at V_power_2 falls below a threshold $V_{T1}$, suggesting a low BL_pgm has been established. This triggers the programming operation by applying a high voltage charging pulse to WL_pgm. Additionally or alternatively, high BL_inhibit voltage may be detected using V_power_3. At T1, V_power_3 is detected to exceed a threshold $V_{T2}$, suggesting a high BL_inhibit has been established. The wait time then expires, and the programming operation begins at T1 to charging up WL_pgm. The threshold voltages $V_{T1}$ and $V_{T2}$ may each be pre-determined values, or adjustable values. In various examples, a user may adjust the threshold voltage $V_{T1}$ or $V_{T2}$ to achieve different wait time $t_{wait}$, thereby automatically triggering the programming operation at desired time.

Figure 7:
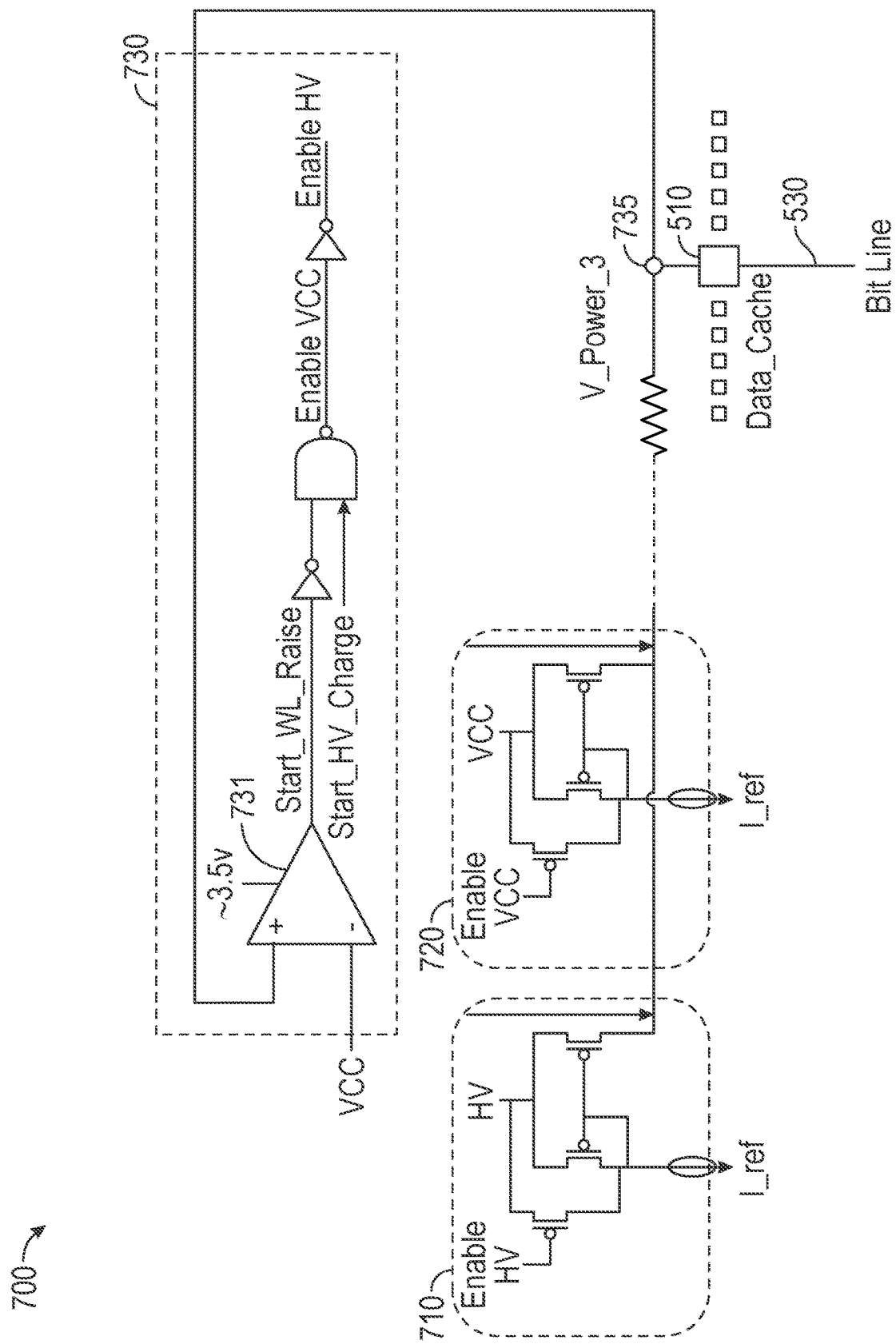
FIG. 7 is a schematic diagram illustrating an example of a BL charging circuit configured to charge a BL to maintain a high BL_inhibit voltage during the programming operation.

FIG. 7 is a schematic diagram illustrating an example of a BL charging circuit 700 configured to provide an inhibit signal to charge a BL to maintain a high BL_inhibit voltage during the programming operation. The BL charging circuit 700 may also mitigate the BL_inhibit voltage drop during the wait time due to inter-BL coupling.

As discussed above, channel leakage may slow down the charging the BL_inhibit to $V_{CC}$, thereby extending the program time $t_{PROG}$. To prevent channel leakage, the voltage on BL_inhibit needs to be set as high as possible. As WL_pgm goes up to program a memory cell, the channel inside the inhibit-pillar must be boosted up to a target voltage of $V_{CC}$. Conventionally, BL_inhibit is charged up using the voltage supply $V_{CC}$. However, if the target voltage on BL_inhibit (source) is $V_{CC}$ and the voltage source (drain) is $V_{CC}$ as well, it would take significant time for BL_inhibit to reach at full $V_{CC}$. To speed up BL charging process and reduce $t_{PROG}$, the BL charging circuit 700 utilizes a voltage source higher than $V_{CC}$ to speed up the charging process and reduce $t_{PROG}$.

The BL charging circuit 700 includes a first BL charging path 710 (e.g., a first charging circuit, an HV charging circuit, etc.), and a second BL charging path 720 (e.g., a second charging circuit, a $V_{CC}$ charging circuit, etc.). The first BL charging path 710, when enabled by the control signal Enable_HV, can charge the BL 530 using a high-voltage (HV) source higher than $V_{CC}$. Examples of the HV source may include a charge pump, an external power source ($V_{CC-EXT}$), or other regulated voltage source. In an example, $V_{CC}$ is approximately 2.2V, and $V_{CC-EXT}$ is approximately 2.35V. The second BL charging path 720, when enabled by the control signal Enable_$V_{CC}$, is configured to charge the BL 530 using the source $V_{CC}$. The BL charging circuit 700 includes a feedback charge control circuit 730, which include a comparator 731 that can sample the voltage on the BL (such as from the node 735), compare it to a target BL_inhibit voltage (e.g., $V_{CC}$) to determine when to raise WL voltage (START_WL_RAISE).

The feedback charge control circuit 730 includes a logic circuit that can generate the control signals Enable_HV and Enable_$V_{CC}$. In this example as illustrated, only one of the sources, HV or $V_{CC}$, is enabled at a time. This results in a two-step BL charging process, including an initial charging phase using the second BL charging path 720 (and $V_{CC}$), and a subsequent second charging phase using the first BL charging path 710 (and HV). Generally, the initial phase of charging requires the biggest current, as most of the BLs are inhibited. $V_{CC}$, which is a robust power source, may provide reliable and strong charging current in the initial phase. Assigned HV source may not have a good capability to supply huge current, since it is either charge-pump or external $V_{CC}$ supply. When the BL voltages reaches a level near $V_{CC}$, higher voltage source HV takes control to fast charge the BL until the inhibit signal (e.g., the BL voltage) reaches the target voltage of $V_{CC}$.

The two-step charging as discussed herein may not only speed up BL_inhibit charging process, but may also improve robustness of BL charging. If only high voltage source HV (e.g., $V_{CC\text{-}EXT}$ or charge pump) is used and the loading is light (e.g., the last programming high voltage pulse), V_power_3 may go beyond $V_{CC}$ very quickly and cause forward-biasing. The proposed switching between $V_{CC}$ and HV, particularly the two-step process, may reduce the risk of forward-biasing inside DATA_CACHE, since N-well inside DATA_CACHE is connected to $V_{CC}$.

Figure 8:
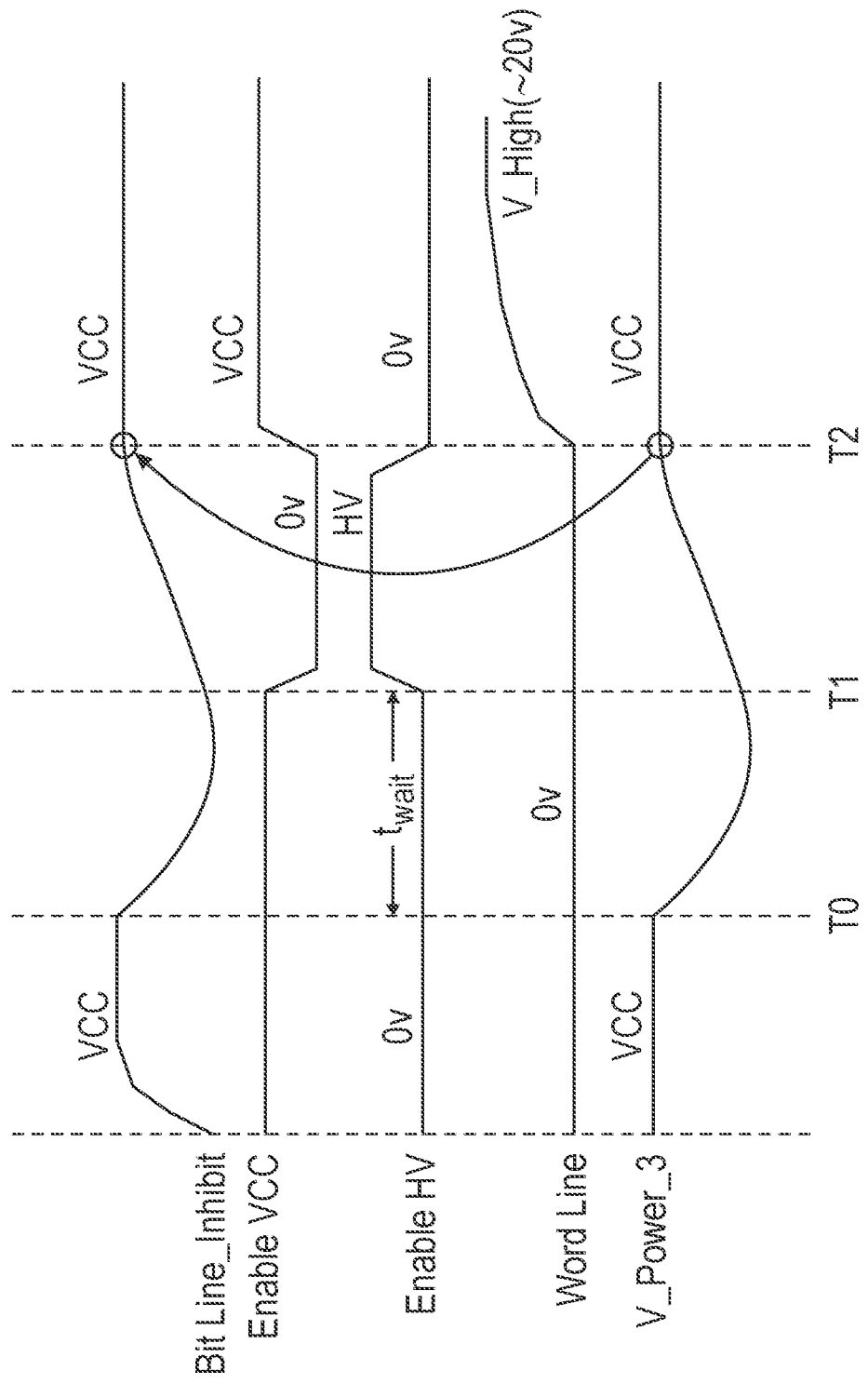
FIG. 8 is a timing diagram illustrating event sequence during the charging of the BL_inhibit, such as by using the BL charging circuit as depicted in FIG. 7.

FIG. 8 is a timing diagram illustrating event sequence during the charging of the BL_inhibit, such as by using the BL charging circuit 700. Charging commences at time T0. During the initial phase of charging, $V_{CC}$ is enabled (Enable_$V_{CC}$=1) and HV source is disabled (Enable_HV=0). After an initial voltage drop at V_power_3 and the BL_inhibit (due to coupling with BL_pgm), the second BL charging path 720 provides an inhibit signal to charge upBL_inhibit. The initial charge lasts for a pre-determined time period $t_{wait}$. By the time T1, V_power_3 is still lower than $V_{CC}$. Therefore, the comparator 731 output, START_WL_RAISE, is at logic "0", and WL_pgm remains low at 0V. At this time, START_HV_CHARGE is at logic "1". The logic circuit in the feedback charge control circuit 730 then outputs the charging circuit control signals Enable_$V_{CC}$=0 and Enable_HV=1. As such, the high-voltage BL charging path 710 becomes activated, and the second BL charging circuit 720 is deactivated. From time T1, the HV source provides an inhibit signal to charge the BL_inhibit using the HV source, raising the voltage at V_power_3. When V_power_3 (and BL_inhibit) reaches a level of approximately $V_{CC}$ at time T2, the output of comparator 731, START_WL_RAISE, flips to logic "1". This raises WL_pgm voltage and initiates the programming operation. At the same time, the logic circuit in the feedback charge control circuit 730 outputs charging circuit control signals Enable_$V_{CC}$=1 and Enable_HV=0. The second BL charging circuit 720 resumes its control over the BL charging, and keeps the V_power_3 and BL_inhibit at $V_{CC}$ during programming operation.

Figure 9:
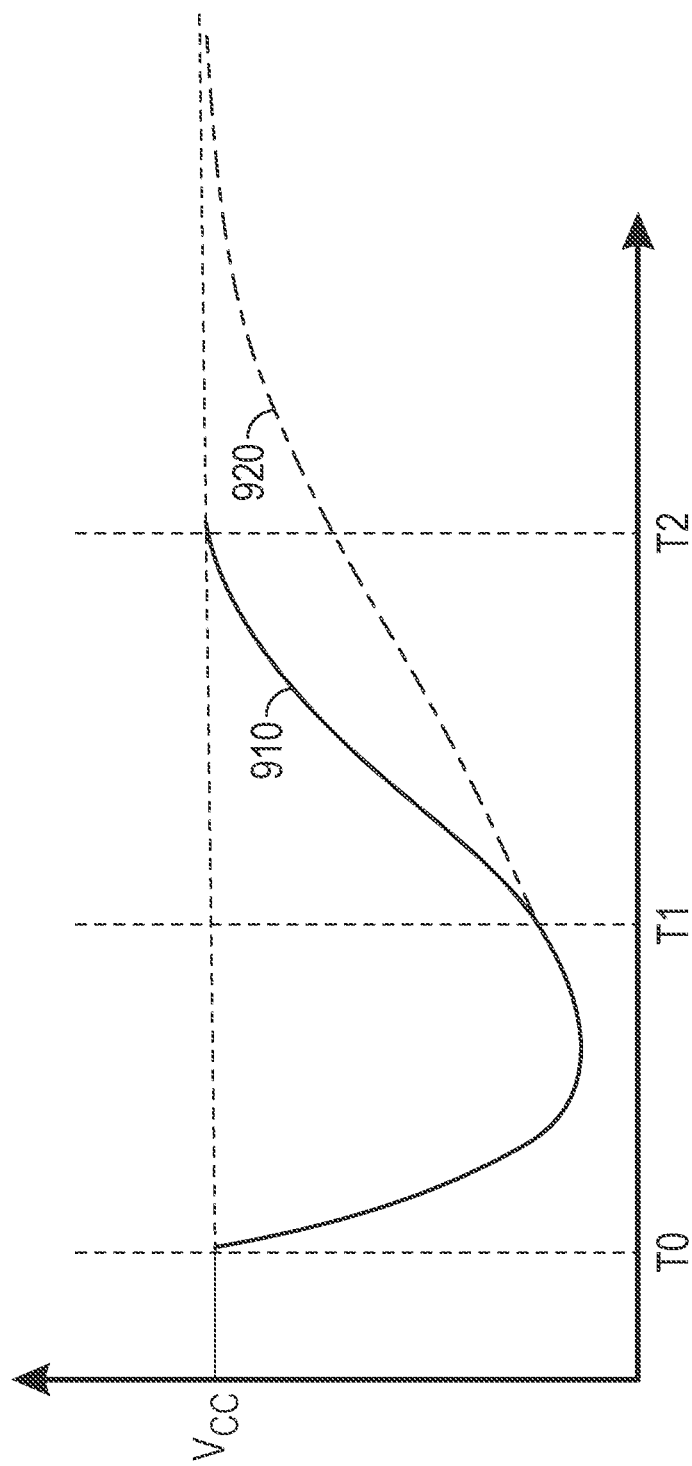
FIG. 9 is a diagram illustrating the voltage on the BL_inhibit during the charging process.

FIG. 9 is a diagram illustrating the voltage on the BL_inhibit during the charging process. Charging curve 910 represents voltage on BL_inhibit over time using the two-step charging process as discussed above, including an initial phase (between time T0 and T1) using the second BL charging path 720, and a subsequent second phase (between T1 and T2) where the BL charging is switched to the first BL charging path 710. For comparison, charging curve 920 represents voltage on BL_inhibit over time using the second BL charging path 720 throughout without switching to high-voltage charging. In this illustrated example, the fast charging provided by the first BL charging path 710 and the high-voltage source is more efficient, and substantially speeds up the charging of the BL_inhibit to the target voltage of $V_{CC}$.

Figure 10:
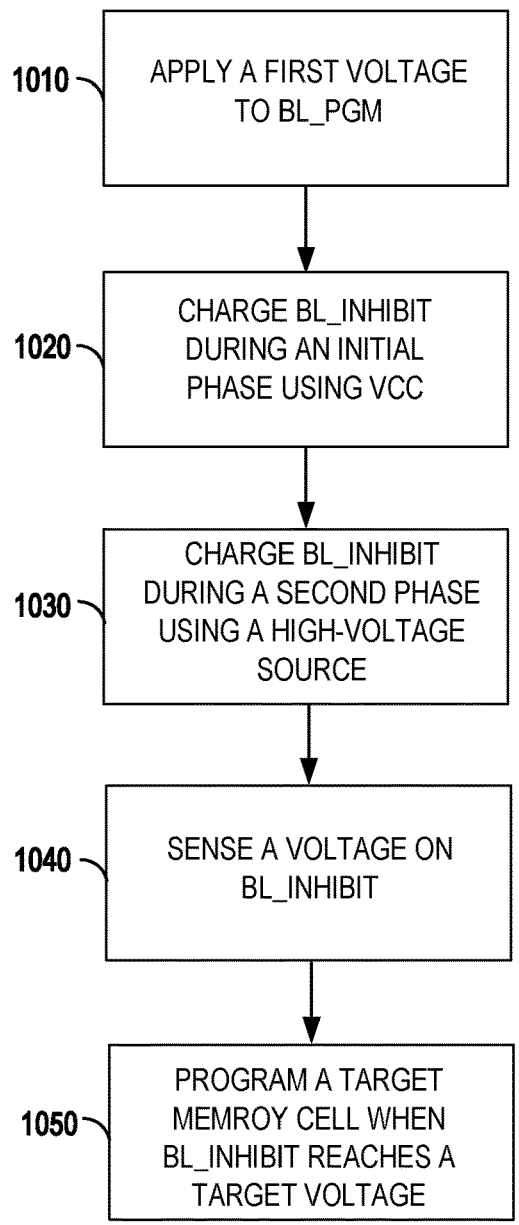
FIG. 10 is a flow chart illustrating a method of programming a memory device that includes an array of memory cells coupled to a plurality of BLs.

FIG. 10 is a flow chart illustrating a method 1000 of programming a memory device that includes an array of memory cells coupled to a plurality of bit lines (BLs). The programming operation involves, among other things, monitoring BL voltage, and charging a BL associated with non-target memory cells not for programming high (BL_inhibit) to a desired positive voltage prior to commencing the programming operation. In an example, the method 1000 may be implemented in and executed by the BL monitor circuit 500 (for monitoring BL voltage) and the BL charging circuit 700 (for charging the BL_inhibit and maintaining the desired inhibit voltage during the programming operation), as discussed in reference of FIGS. 5 and 7.

The method 1000 commences at 1010 to apply a first voltage to the BL of the target memory cells for programming (BL_pgm) and the source/drain channel. The first voltage may be a low potential, such as GND or Vss. Programming typically involves applying a high positive programming voltage $V_{PGM}$ (typically 16V, and up to 20V) to a word line in communication with the control gates of the target memory cells for programming (WL_pgm). The high WL_pgm voltage and the low BL_pgm voltage may cause charge transfer from the BL (channel) to the floating gates of the targets memory cells via direct injection, or other mechanism such as Fowler-Nordheim (FN) tunneling.

At 1020, BLs of the memory cells not targeted for programming (BL_inhibit) may be charged to a high voltage (e.g., $V_{CC}$) when programming a memory cell. As discussed above, low BL_pgm voltage may cause source/drain channel leakage, leading to significant program disturb, and extend program time ($t_{PROG}$). Raising the BL_inhibit prior to initiating programming operation may potentially reduce $t_{PROG}$ and prevent program disturb. Charging of the BL_inhibit may be achieved using the BL charging circuit 700 and (e.g., at least) a high-voltage source (HV) higher than the supply voltage $V_{CC}$. Examples of the HV source may include a charge pump, an external power source ($V_{CC\text{-}EXT}$), or other regulated voltage source. Compared to charging with the $V_{CC}$ alone, using HV may speed up BL charging process and reduce $t_{PROG}$.

In an example, the BL charging may be done in a two-step process including an initial charging phase using the high-voltage (HV) source, and a subsequent later charging phase using the $V_{CC}$. At 1020, the initial charging phase may be carried out using the second BL charging path 720. Generally, the initial charging phase requires the biggest current, as most of the BLs are inhibited. Supply voltage $V_{CC}$ may provide reliable and strong charging current in the initial phase. The initial charging phase may sustain for a specified time period (e.g., $t_{wait}$ as shown in FIG. 8). Then, at 1030, a later charging phase commences, and the high-voltage BL charging path 710 starts to charge the BL_inhibit using the HV source. Because the HV source is higher than $V_{CC}$, it takes less time to raise the BL_inhibit voltage to a desired level (e.g., of approximately $V_{CC}$) when switching to the HV source than sticking to $V_{CC}$, as illustrated in an example shown in FIG. 9.

At 1040, voltage on the BL_inhibit may be continuously or periodically monitored during the charging process, such by using the BL monitor circuit 500. As discussed above, detecting a high voltage on BL_inhibit and use that detection to trigger a programming operation on target memory cells may prevent channel leakage and program disturb, thereby increasing programming reliability. This may be advantageous than triggering a programming operation merely based on a detection of a low voltage on BL_pgm. In an example, the BL_inhibit may be monitored by sensing a voltage at a detecting point V_power_3 of the BL monitor circuit 500.

The detected voltage on the BL_inhibit may be compared to a threshold voltage, such by using the comparator 731 of the feedback charge control circuit 730. At 1050, when the detected voltage at V_power_3 satisfies a specified condition such as exceeding the threshold, BL_inhibit is deemed high (e.g., at approximately $V_{CC}$), which triggers the programming operation to occur. A programming voltage (V_pgm) may then be applied to a WL to program one of the target memory cells. High BL_inhibit voltage maintained at approximately $V_{CC}$ during programming operation may effectively prevent leakage from the channel, reduce program disturb on non-target memory cells, and improve overall programming performance.

Figure 11:
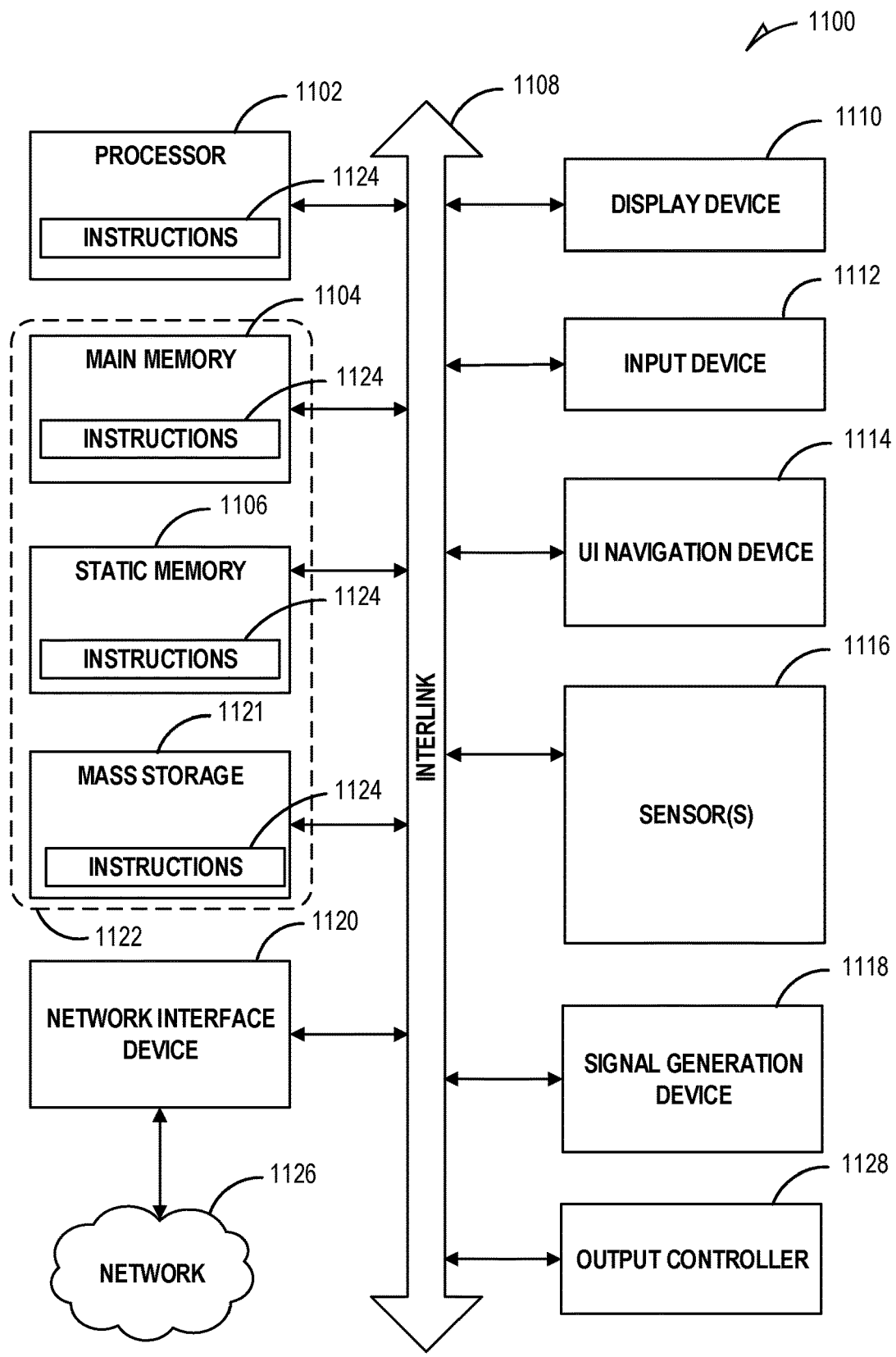
FIG. 11 is a block diagram illustrating an example of a machine upon which one or more embodiments may be implemented.

FIG. 11 illustrates a block diagram of an example machine 1100 upon which any one or more of the techniques (e.g., methodologies) discussed herein may perform. In alternative embodiments, the machine 1100 may operate as a stand-alone device or may be connected (e.g., networked) to other machines. In a networked deployment, the machine 1100 may operate in the capacity of a server machine, a client machine, or both in server-client network environments. In an example, the machine 1100 may act as a peer machine in peer-to-peer (P2P) (or other distributed) network environment. The machine 1100 may be a personal computer (PC), a tablet PC, a set-top box (STB), a personal digital assistant (PDA), a mobile telephone, a web appliance, an IoT device, automotive system, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, may include, or may operate by, logic, components, devices, packages, or mechanisms. Circuitry is a collection (e.g., set) of circuits implemented in tangible entities that include hardware (e.g., simple circuits, gates, logic, etc.). Circuitry membership may be flexible over time and underlying hardware variability. Circuitries include members that may, alone or in combination, perform specific tasks when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a computer readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable participating hardware (e.g., the execution units or a loading mechanism) to create members of the circuitry in hardware via the variable connections to carry out portions of the specific tasks when in operation. Accordingly, the computer readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry at a different time.

The machine (e.g., computer system) 1100 (e.g., the host device 105, the memory device 110, etc.) may include a hardware processor 1102 (e.g., a central processing unit (CPU), a graphics processing unit (GPU), a hardware processor core, or any combination thereof, such as the memory controller 115, etc.), a main memory 1104 and a static memory 1106, some or all of which may communicate with each other via an interlink (e.g., bus) 1108. The machine 1100 may further include a display unit 1110, an alphanumeric input device 1112 (e.g., a keyboard), and a user interface (UI) navigation device 1114 (e.g., a mouse). In an example, the display unit 1110, input device 1112 and UI navigation device 1114 may be a touch screen display. The machine 1100 may additionally include a signal generation device 1118 (e.g., a speaker), a network interface device 1120, and one or more sensors 1116, such as a global positioning system (GPS) sensor, compass, accelerometer, or other sensor. The machine 1100 may include an output controller 1128, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The machine 1100 may include a machine readable medium 1122 on which is stored one or more sets of data structures or instructions 1124 (e.g., software) embodying or utilized by any one or more of the techniques or functions described herein. The instructions 1124 may also reside, completely or at least partially, within the main memory 1104, within static memory 1106, or within the hardware processor 1102 during execution thereof by the machine 1100. In an example, one or any combination of the hardware processor 1102, the main memory 1104, or the static memory 1106 may constitute the machine readable medium 1122.

While the machine readable medium 1122 is illustrated as a single medium, the term "machine readable medium" may include a single medium or multiple media (e.g., a centralized or distributed database, or associated caches and servers) configured to store the one or more instructions 1124.

The term "machine readable medium" may include any medium capable of storing or encoding instructions for execution by the machine 1100 and that cause the machine 1100 to perform any one or more of the techniques of the present disclosure, or capable of storing, encoding or carrying data structures used by or associated with such instructions. Non-limiting machine readable medium examples include solid-state memories, and optical and magnetic media. In an example, a massed machine readable medium comprises a machine-readable medium with a plurality of particles having invariant (e.g., rest) mass. Accordingly, massed machine-readable media are not transitory propagating signals. Specific examples of massed machine readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The instructions 1124 (e.g., software, programs, an operating system (OS), etc.) or other data are stored on the storage device 1121, can be accessed by the memory 1104 for use by the processor 1102. The memory 1104 (e.g., DRAM) is typically fast, but volatile, and thus a different type of storage than the storage device 1121 (e.g., an SSD), which is suitable for long-term storage, including while in an "off" condition. The instructions 1124 or data in use by a user or the machine 1100 are typically loaded in the memory 1104 for use by the processor 1102. When the memory 1104 is full, virtual space from the storage device 1121 can be allocated to supplement the memory 1104; however, because the storage 1121 device is typically slower than the memory 1104, and write speeds are typically at least twice as slow as read speeds, use of virtual memory can greatly reduce user experience due to storage device latency (in contrast to the memory 1104, e.g., DRAM). Further, use of the storage device 1121 for virtual memory can greatly reduce the usable lifespan of the storage device 1121.

In contrast to virtual memory, virtual memory compression (e.g., the Linux® kernel feature "ZRAM") uses part of the memory as compressed block storage to avoid paging to the storage device 1121. Paging takes place in the compressed block until it is necessary to write such data to the storage device 1121. Virtual memory compression increases the usable size of memory 1104, while reducing wear on the storage device 1121.

Storage devices optimized for mobile electronic devices, or mobile storage, traditionally include MMC solid-state storage devices (e.g., micro Secure Digital (microSD™) cards, etc.). MMC devices include a number of parallel interfaces (e.g., an 8-bit parallel interface) with a host device, and are often removable and separate components from the host device. In contrast, eMMC™ devices are attached to a circuit board and considered a component of the host device, with read speeds that rival serial ATA™ (Serial AT (Advanced Technology) Attachment, or SATA) based SSD devices. However, demand for mobile device performance continues to increase, such as to fully enable virtual or augmented-reality devices, utilize increasing networks speeds, etc. In response to this demand, storage devices have shifted from parallel to serial communication interfaces. Universal Flash Storage (UFS) devices, including controllers and firmware, communicate with a host device using a low-voltage differential signaling (LVDS) serial interface with dedicated read/write paths, further advancing greater read/write speeds.

The instructions 1124 may further be transmitted or received over a communications network 1126 using a transmission medium via the network interface device 1120 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, the network interface device 1120 may include one or more physical jacks (e.g., Ethernet, coaxial, or phone jacks) or one or more antennas to connect to the communications network 1126. In an example, the network interface device 1120 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium capable of storing, encoding or carrying instructions for execution by the machine 1100, and includes digital or analog communications signals or other intangible medium to facilitate communication of such software.

The above detailed description includes references to the accompanying drawings, which form a part of the detailed description. The drawings show, by way of illustration, specific embodiments in which the invention can be practiced. These embodiments are also referred to herein as "examples". Such examples can include elements in addition to those shown or described. However, the present inventor also contemplates examples in which only those elements shown or described are provided. Moreover, the present inventor also contemplates examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" may include "A but not B," "B but not A," and "A and B," unless otherwise indicated. In the appended claims, the terms "including" and "in which" are used as the plain-English equivalents of the respective terms "comprising" and "wherein". Also, in the following claims, the terms "including" and "comprising" are open-ended, i.e., a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

In various examples, the components, controllers, processors, units, engines, or tables described herein can include, among other things, physical circuitry or firmware stored on a physical device. As used herein, "processor" means any type of computational circuit such as, but not limited to, a microprocessor, a microcontroller, a graphics processor, a digital signal processor (DSP), or any other type of processor or processing circuit, including a group of processors or multi-core devices.

Various embodiments according to the present disclosure and described herein include memory utilizing a vertical structure of memory cells (e.g., NAND strings of memory cells). As used herein, directional adjectives will be taken relative a surface of a substrate upon which the memory cells are formed (i.e., a vertical structure will be taken as extending away from the substrate surface, a bottom end of the vertical structure will be taken as the end nearest the substrate surface and a top end of the vertical structure will be taken as the end farthest from the substrate surface).

Operating a memory cell, as used herein, includes reading from, writing to, or erasing the memory cell. The operation of placing a memory cell in an intended state is referred to herein as "programming," and can include both writing to or erasing from the memory cell (e.g., the memory cell may be programmed to an erased state).

According to one or more embodiments of the present disclosure, a memory controller (e.g., a processor, controller, firmware, etc.) located internal or external to a memory device, is capable of determining (e.g., selecting, setting, adjusting, computing, changing, clearing, communicating, adapting, deriving, defining, utilizing, modifying, applying, etc.) a quantity of wear cycles, or a wear state (e.g., recording wear cycles, counting operations of the memory device as they occur, tracking the operations of the memory device it initiates, evaluating the memory device characteristics corresponding to a wear state, etc.)

According to one or more embodiments of the present disclosure, a memory access device may be configured to provide wear cycle information to the memory device with each memory operation. The memory device control circuitry (e.g., control logic) may be programmed to compensate for memory device performance changes corresponding to the wear cycle information. The memory device may receive the wear cycle information and determine one or more operating parameters (e.g., a value, characteristic) in response to the wear cycle information.

It will be understood that when an element is referred to as being "on," "connected to" or "coupled with" another element, it can be directly on, connected, or coupled with the other element or intervening elements may be present. In contrast, when an element is referred to as being "directly on," "directly connected to" or "directly coupled with" another element, there are no intervening elements or layers present. If two elements are shown in the drawings with a line connecting them, the two elements can be either be coupled, or directly coupled, unless otherwise indicated.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact discs and digital video disks), magnetic cassettes, memory cards or sticks, random access memories (RAMs), read only memories (ROMs), solid state drives (SSDs), Universal Flash Storage (UFS) device, embedded MMC (eMMC) device, and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

OTHER NOTES AND EXAMPLES

Example 1 is a memory device, comprising: an array of memory cells; a first bit line (BL) associated with target memory cells for programming and a second BL associated with non-target memory cells not for programming; a BL charging circuit configured to charge a BL using a high-voltage source higher than a supply voltage (VCC); and a controller in communication with the first and second BLs. The controller is configured to, in response to a programming command, apply a first voltage to the first BL, and enable the BL charging circuit to charge the second BL using the high-voltage source during a specified BL charging time.

In Example 2, the subject matter of Example 1 optionally includes the array of memory cells that may include an array of NAND memory cells.

Example 3, the subject matter of any one or more of Examples 1-2 optionally include: the BL charging circuit that may include a first path coupled to the high-voltage source and a second path coupled to the supply voltage VCC; and the controller that is configured to enable the BL charging circuit to charge the second BL using the first path during a first BL charging time and to charge the second BL using the second path during a second BL charging time.

In Example 4, the subject matter of Example 3 optionally includes the first BL charging time that begins following the end of the second BL charging time.

In Example 5, the subject matter of Example 4 optionally includes the second BL charging time that is a pre-determined time period.

In Example 6, the subject matter of any one or more of Examples 3-5 optionally include the high-voltage source that may include a charge pump circuit or an external power supply.

In Example 7, the subject matter of any one or more of Examples 3-6 optionally include a BL voltage sensing circuit configured to sense a voltage on the second BL. The controller may be configured to switch between the first and second paths to charge the second BL based at least on the sensed voltage on the second BL.

In Example 8, the subject matter of Example 7 optionally includes the controller that may be configured to program one or more of the target memory cells in response to the sensed voltage on the second BL exceeding a threshold.

In Example 9, the subject matter of Example 8 optionally includes a plurality of word lines (WLs) coupled to respective control gates of the memory cells. The controller may be configured to apply a programming voltage to the WLs of the one or more of the memory cells targeted for programming.

In Example 10, the subject matter of any one or more of Examples 3-9 optionally includes the controller that may be configured to switch to the second path to charge the second BL when the sensed voltage on the second BL reaches a value substantially equal to the supply voltage VCC.

In Example 11, the subject matter of any one or more of Examples 1-10 optionally includes the first voltage applied to the first BL is substantially 0V.

In Example 12, the subject matter of any one or more of Examples 7-11 optionally includes the BL voltage sensing circuit that may be further configured to sense a voltage on the first BL, and the controller that may be configured to program one or more of the target memory cells for programming further in response to the sensed voltage on the first BL falling below a threshold.

Example 13 is a method of programming a memory device that includes an array of memory cells coupled to a plurality of bit lines (BLs). The method comprises steps of: applying a first voltage to a first BL associated with target memory cells for programming; and charging a second BL during a specified BL charging time using a high-voltage source higher than a supply voltage (VCC), the second BL associated with non-target memory cells not for programming.

In Example 14, the subject matter of Example 13 optionally includes charging the second BL that may include charging the second BL using a first path coupled to the high-voltage source during a first BL charging time and charging the second BL using a second path coupled to the supply voltage VCC during a second BL charging time.

In Example 15, the subject matter of Example 14 optionally includes the first BL charging time that begins following the end of the second BL charging time.

In Example 16, the subject matter of Example 15 optionally includes the second BL charging time that has a predetermined duration.

In Example 17, the subject matter of any one or more of Examples 14-16 optionally includes steps of: sensing a voltage on the second BL; and switching between the first and second paths to charge the second BL based at least on the sensed voltage on the second BL.

In Example 18, the subject matter of any one or more of Examples 16-17 optionally includes switching to the second path to charge the second BL when the sensed voltage on the second BL reaches a value substantially equal to the supply voltage VCC.

In Example 19, the subject matter of any one or more of Examples 13-18 optionally includes the first voltage applied to the first BL being substantially 0V.

In Example 20, the subject matter of any one or more of Examples 13-19 optionally includes, in response to the sensed voltage on the second BL exceeding a threshold, applying a programming voltage to a word line to program one of the target memory cells.

Example 21 is a memory device, comprising: a group of memory cells including a first memory cell coupled to a first bit line (BL) and a second memory cell coupled to a second BL; and a BL charging circuit configured to provide an inhibit signal to the second BL in response to a control signal to program the first memory cell, wherein, to provide the inhibit signal, the BL charging circuit is configured to apply a supply voltage (VCC) to the second BL for an initial wait time and, after the initial wait time, to apply a higher voltage than the supply voltage (VCC) until the inhibit signal reaches a value of the supply voltage (VCC).

In Example 22, the subject matter of Example 21 optionally includes the first memory cell that may include a target memory cell to be programmed by a programming operation and the second memory cell includes a non-target memory cell to not be programmed by the programming operation, and wherein the first and second memory cells include NAND memory cells.

In Example 23, the subject matter of any one or more of Examples 21-22 optionally includes the BL charging circuit that may include a first charging path coupled between the high-voltage source and the second BL, and a second charging path coupled between the supply voltage (VCC) and the second BL.

In Example 24, the subject matter of Example 23 optionally includes the first and second charging path each including respective P-type metal-oxide-semiconductor (PMOS) transistors.

In Example 25, the subject matter of any one or more of Examples 21-24 optionally includes the initial wait time that may be a predetermined time period.

In Example 26, the subject matter of any one or more of Examples 21-25 optionally includes the high-voltage source that may be a charge pump circuit or an external power supply.

In Example 27, the subject matter of any one or more of Examples 21-26 optionally includes a BL voltage sensing circuit configured to sense a voltage on the second BL, and wherein the BL charging circuit is configured to switch from the supply voltage (VCC) to the high-voltage source to charge the second BL when the sensed voltage on the second BL exceeds a threshold voltage.

In Example 28, the subject matter of any one or more of Examples 21-27 optionally includes the BL charging circuit that may be configured to switch to the supply voltage (VCC) to charge the second BL after the sensed voltage on the second BL reaches the value of the supply voltage (VCC).

In Example 29, the subject matter of any one or more of Examples 21-28 optionally includes a memory control circuit configured to apply a voltage of substantially 0V to the first BL in response to the control signal to program the first memory cell.

In Example 30, the subject matter of any one or more of Examples 21-29 optionally includes the memory control circuit that may be configured to provide a programming signal to a word line (WL) coupled to the first memory cell.

In Example 31, the subject matter of Example 30 optionally includes the memory control circuit that may be configured to provide the programming signal to the WL when the inhibit signal on the second BL reaches a value of the supply voltage (VCC).

In Example 32, the subject matter of Example 31 optionally includes the memory control circuit that may be configured to provide the programming signal to the WL further in response to a voltage on the first BL falling below a threshold.

Example 33 is a memory device, comprising: an NAND memory cell array; a memory control circuit coupled to the NAND memory cell array via a group of bit lines (BLs), including a first BL coupled to a string of NAND memory cells including a target memory cell to be programmed by a programming operation, and a second BL coupled to a string of NAND memory cells including a non-target memory cell to not be programmed by the programming operation, wherein the memory control circuit is configured to, in response to a control signal to program the first memory cell: provide an inhibit signal to the second BL, wherein, to provide the inhibit signal, the memory control circuit is configured to apply a supply voltage (VCC) to the second BL for an initial wait time and, after the initial wait time, apply a higher voltage than the supply voltage (VCC) until the inhibit signal reaches a value of the supply voltage (VCC); and provide a programming signal to a word line (WL) coupled to the first memory cell when the inhibit signal on the second BL reaches a value of the supply voltage (VCC).

Example 34 is a method of programming a memory device that includes a group of memory cells including a first memory cell coupled to a first bit line (BL) and a second memory cell coupled to a second BL, the method comprising: in response to a control signal to program the first memory cell, providing an inhibit signal to the second BL by coupling a supply voltage (VCC) to the second BL for an initial wait time; and after the initial wait time, applying a higher voltage than the supply voltage (VCC) to the second BL until the inhibit signal reaches a value of the supply voltage (VCC).

In Example 35, the subject matter of Example 34 optionally includes the initial wait time that may be a predetermined time period.

In Example 36, the subject matter of any one or more of Examples 34-35 optionally includes steps of sensing a voltage on the second BL and switching from the supply voltage (VCC) to the higher voltage to charge the second BL when the sensed voltage on the second BL exceeds a threshold voltage.

In Example 37, the subject matter of Example 36 optionally includes switching to the supply voltage (VCC) to charge the second BL after the sensed voltage on the second BL reaches the value of the supply voltage (VCC).

In Example 38, the subject matter of any one or more of Examples 34-37 optionally includes applying a voltage of substantially 0V to the first BL in response to the control signal to program the first memory cell.

In Example 39, the subject matter of any one or more of Examples 34-38 optionally includes providing a programming signal to a word line (WL) coupled to the first memory cell when the inhibit signal on the second BL reaches a value of the supply voltage (VCC).

In Example 40, the subject matter of Example 39 optionally includes providing a programming signal to the WL coupled to the first memory cell further in response to a voltage of the first BL falling below a threshold.

The invention claimed is:

1. A memory device, comprising:
   a group of memory cells including a first memory cell coupled to a first bit line (BL) and a second memory cell coupled to a second BL; and
   a BL charging circuit configured to provide an inhibit signal to the second BL in response to a control signal to program the first memory cell,
     wherein, to provide the inhibit signal, the BL charging circuit is configured to:
     apply a first voltage to the second BL for a first period; and
     after the first period, apply a second voltage higher than the first voltage to the second BL until the inhibit signal reaches a first threshold voltage at the second BL;
   wherein a transition from application of the first voltage to application of the second voltage occurs in response to a monitored condition.

2. The memory device of claim 1, wherein the monitored condition comprises a monitored voltage at the second BL.

3. The memory device of claim 2, comprising a comparator circuit configured to compare the monitored voltage to a second threshold voltage, wherein the transition from application of the first voltage to application of the second voltage occurs in response to determining a specified relationship between the monitored voltage on the second BL relative to the second threshold voltage.

4. The memory device of claim 2, comprising a multiplexer configured to switch between a charge mode to enable charging of the second BL via a first switch, and a monitor mode to enable monitoring the voltage on the second BL via a second switch.

5. The memory device of claim 1, wherein the second voltage is supplied by a second voltage supply comprising a charge pump or an external power supply, and the monitored condition comprises an operational state of the second voltage supply.

6. The memory device of claim 1, wherein the first threshold voltage at the second BL is equal to the first voltage.

7. The memory device of claim 6, wherein the first threshold voltage at the second BL is a user adjustable threshold.

8. The memory device of claim 1, wherein the BL charging circuit is configured to apply the first voltage to the second BL in response to the inhibit signal reaching the first threshold voltage.

9. The memory device of claim 1, comprising a memory control circuit configured to apply a voltage of substantially 0V to the first BL in response to the control signal to program the first memory cell.

10. The memory device of claim 9, comprising a charging circuit configured to apply a programming voltage to a word line (WL) to program the first memory cell coupled to the WL when the inhibit signal on the second BL reaches a value of the first threshold voltage.

11. The memory device of claim 10, wherein the charging circuit is configured to apply the charging voltage to the WL further in response to a voltage on the first BL falling below a third threshold.

12. The memory device of claim 10, wherein the BL charging circuit is configured to maintain the second BL at a level of the first voltage during the programming of the first memory cell.

13. A memory device, comprising:
    an NAND memory cell array;
    a memory control circuit coupled to the NAND memory cell array via a group of bit lines (BLs), including a first BL coupled to a string of NAND memory cells including a target memory cell to be programmed by a programming operation, and a second BL coupled to a string of NAND memory cells including a non-target memory cell to not be programmed by the programming operation, wherein the memory control circuit is configured to, in response to a control signal to program the first memory cell:
    provide an inhibit signal to the second BL, wherein, to provide the inhibit signal, the memory control circuit is configured to apply a first voltage to the second BL for a first period and, after the first period, apply a second voltage higher than the first voltage until the inhibit signal reaches a first threshold voltage at the second BL; and
    applying a programming voltage to a word line (WL) coupled to the first memory cell when the inhibit signal on the second BL reaches a value of the first threshold voltage.

14. A memory device, comprising:
    a group of memory cells including a first memory cell coupled to a first bit line (BL) and a second memory cell coupled to a second BL; and
    a BL charging circuit configured to provide an inhibit signal to the second BL in response to a control signal to program the first memory cell, the BL charging circuit-including:
    a first BL charging path configured to apply a first voltage to the second BL;

a second BL charging path configured to apply a second voltage, higher than the first voltage, to the second BL; and a charge control circuit configured to:
generate a first control signal to enable the first BL charging path to apply the first voltage to the second BL for a first period; and
after the first period and in response to a monitored condition, generate a second control signal to enable the second BL charging path to apply the second voltage to the second BL until the inhibit signal reaches a first threshold voltage.

15. The memory device of claim 14, wherein the charging control circuit includes a comparator configured to compare a monitored voltage on the BL to a second threshold voltage, wherein the charge control circuit is configured to generate the second control signal to enable the second BL charging path in response to the monitored voltage on the second BL exceeding the second threshold voltage.

16. The memory device of claim 14, wherein:
the first BL charging path is coupled to a first voltage supply comprising a supply voltage ($V_{CC}$) to the second BL; and
the second BL charging path is coupled to a second voltage supply to apply a higher voltage to the second BL.

17. The memory device of claim 16, wherein the second voltage supply comprises a charge pump or an external power source.

18. The memory device of claim 14, wherein the charge control circuit is configured to control the first BL charging path to apply the first voltage to the second BL in response to the inhibit signal reaching the first threshold voltage.

19. The memory device of claim 14, comprising a charging circuit configured to apply a programming voltage to a word line (WL) to program the first memory cell coupled to the WL when the inhibit signal on the second BL reaches a value of the first threshold voltage.

20. The memory device of claim 19, wherein the BL charging circuit is configured to maintain the second BL at a level of the first voltage during the programming of the first memory cell.

* * * * *